(12) United States Patent
Bloom et al.

(10) Patent No.: US 8,264,884 B2
(45) Date of Patent: Sep. 11, 2012

(54) METHODS, CIRCUITS AND SYSTEMS FOR READING NON-VOLATILE MEMORY CELLS

(75) Inventors: Ilan Bloom, Haifa (IL); Eduardo Maayan, Kfar Saba (IL)

(73) Assignee: Spansion Israel Ltd, Netanya (IL)

( * ) Notice: Subject to any disclaimer, the term of this patent is extended or adjusted under 35 U.S.C. 154(b) by 340 days.

(21) Appl. No.: 12/310,354

(22) PCT Filed: Sep. 16, 2007

(86) PCT No.: PCT/IL2007/001135
§ 371 (c)(1),
(2), (4) Date: Feb. 23, 2009

(87) PCT Pub. No.: WO2008/032326
PCT Pub. Date: Mar. 20, 2008

(65) Prior Publication Data
US 2009/0323423 A1 Dec. 31, 2009

(51) Int. Cl.
*G11C 11/34* (2006.01)
(52) U.S. Cl. ......... 365/185.18; 365/189.05; 365/230.06; 365/185.24
(58) Field of Classification Search ............. 365/185.18, 365/189.05, 230.06, 185.24
See application file for complete search history.

(56) References Cited

U.S. PATENT DOCUMENTS

| | | | |
|---|---|---|---|
| 5,650,959 A | 7/1997 | Hayashi et al. | |
| 5,768,192 A | 6/1998 | Eitan | |
| 5,963,465 A | 10/1999 | Eitan | |
| 5,966,603 A | 10/1999 | Eitan | |
| 6,011,725 A | 1/2000 | Eitan | |
| 6,030,871 A | 2/2000 | Eitan | |
| 6,130,452 A | 10/2000 | Lu et al. | |
| 6,133,095 A | 10/2000 | Eitan et al. | |
| 6,175,519 B1 | 1/2001 | Lu et al. | |
| 6,215,148 B1 | 4/2001 | Eitan | |
| 6,233,180 B1 | 5/2001 | Eitan et al. | |
| 6,285,574 B1 | 9/2001 | Eitan | |
| 6,292,394 B1 | 9/2001 | Cohen et al. | |
| 6,323,799 B1 * | 11/2001 | Pasotti et al. | ................. 341/156 |
| 6,448,750 B1 | 9/2002 | Shor et al. | |
| 6,477,084 B1 | 11/2002 | Eitan | |
| 6,552,387 B1 | 4/2003 | Eitan | |
| 6,583,007 B1 | 6/2003 | Eitan | |
| 6,633,496 B2 | 10/2003 | Maayan et al. | |
| 6,649,972 B2 | 11/2003 | Eitan | |

(Continued)

OTHER PUBLICATIONS

"Design Considerations in Scaled SONOS Nonvolatile Memory Devices" found at: http://klabs.org/richcontent/MemoryContent/nvmt_symp/nvmts_2000/presentations/bu_white_sonos_lehigh_univ.pdf.

(Continued)

*Primary Examiner* — Fernando Hidalgo
(74) *Attorney, Agent, or Firm* — Eitan Mehulal & Sadot

(57) ABSTRACT

The present invention includes methods, circuits and systems for reading non-volatile memory ("NVM") cells, including multi-level NVM cells. According to some embodiments of the present invention, there may be provided a NVM cell threshold voltage detection circuit adapted to detect an approximate threshold voltage associated with a charge storage region of a NVM cell, where the NVM cell may be a single or a multi-charge storage region cell. A decoder circuit may be adapted to decode and/or indicate the logical state of a NVM cell charge storage region by mapping or converting a detected approximate threshold voltage of the charge storage region into a logical state value.

10 Claims, 18 Drawing Sheets

U.S. PATENT DOCUMENTS

| | | | |
|---|---|---|---|
| 6,768,165 B1 | 7/2004 | Eitan | |
| 6,954,393 B2 | 10/2005 | Lusky et al. | |
| 6,967,896 B2 | 11/2005 | Eisen et al. | |
| 6,992,932 B2 | 1/2006 | Cohen | |
| 7,242,618 B2 | 7/2007 | Shappir et al. | |
| 7,257,025 B2 | 8/2007 | Maayan et al. | |
| 7,848,141 B2* | 12/2010 | Seong et al. | 365/185.03 |
| 2005/0105337 A1* | 5/2005 | Cohen et al. | 365/185.18 |
| 2005/0286312 A1* | 12/2005 | Wu et al. | 365/185.29 |
| 2006/0279989 A1* | 12/2006 | Seong et al. | 365/185.03 |
| 2007/0253253 A1* | 11/2007 | Aritome | 365/185.17 |

OTHER PUBLICATIONS

"SONOS Nonvolatile Semiconductor Memories for Space and Military Applications" found at http://klabs.org/richcontent/Memory-Content/nvmt_symp/nvmts_2000/papers/adams_d.pdf.

"Philips Research—Technologies—Embedded Nonvolatile Memories" found at: http://www.research.philips.com/technologies/ics/nvmemories/index.html.

"Semiconductor Memory: Non-Volatile Memory (NVM)" found at http://www.ece.nus.edu.sq/stfpage/elezhucx/myweb/NVM.pdf.

* cited by examiner

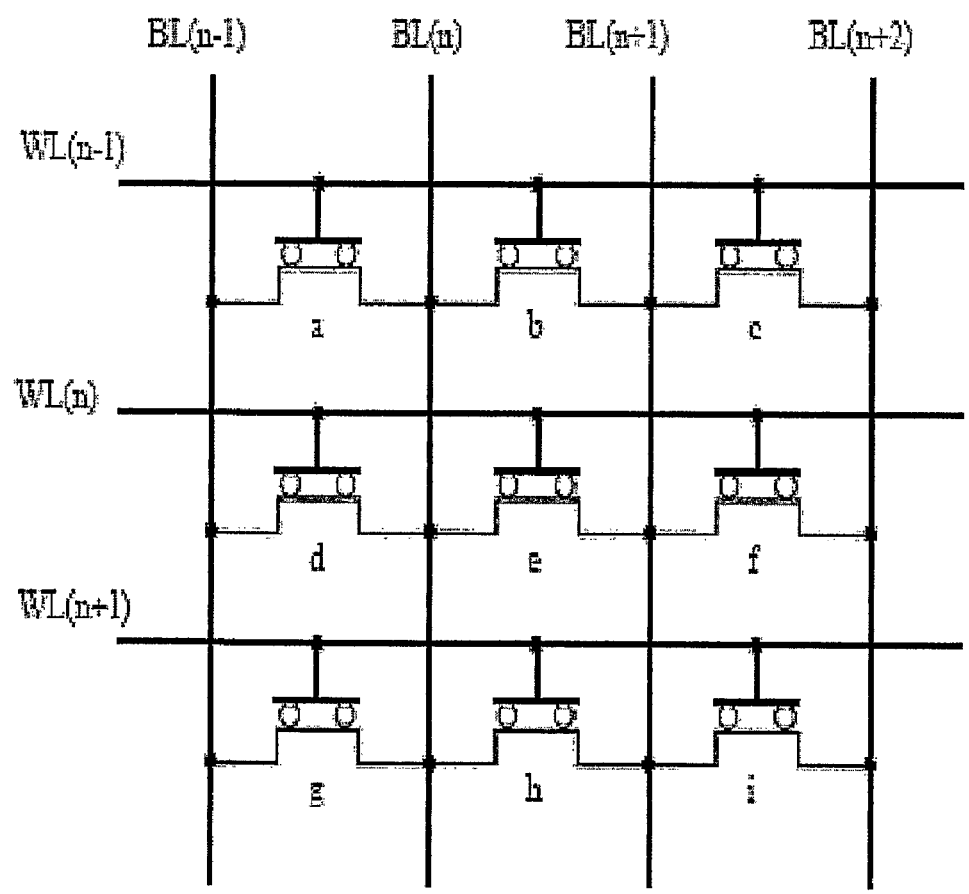

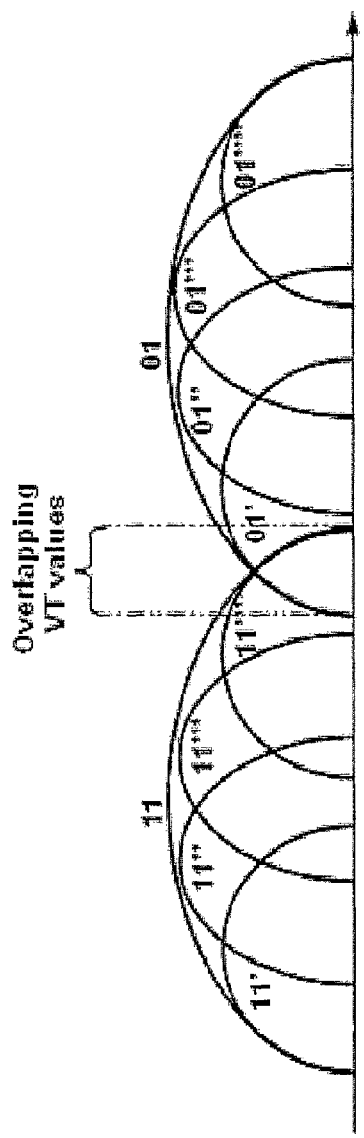
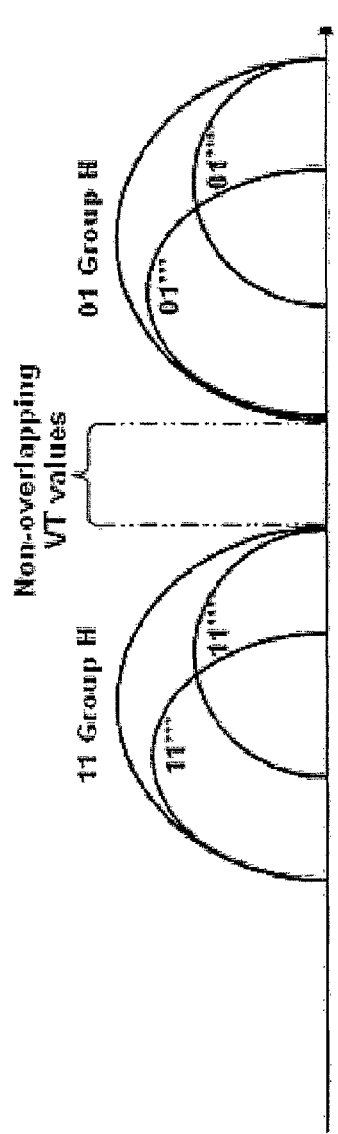
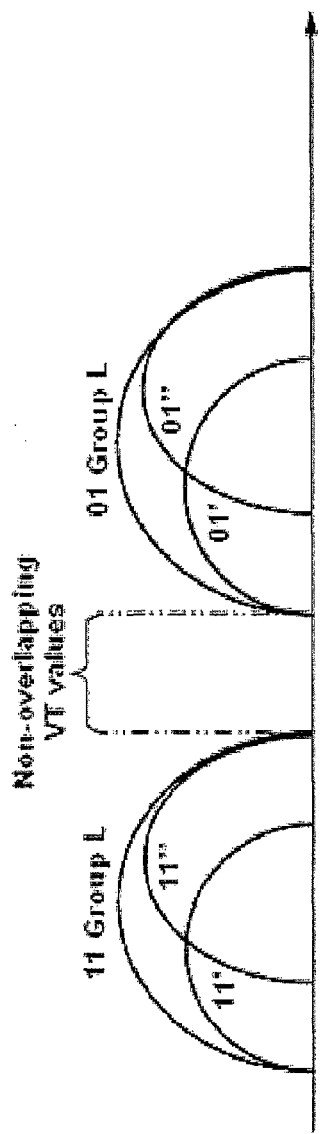
FIG 15A
FIG 15B
FIG 15C

METHODS, CIRCUITS AND SYSTEMS FOR READING NON-VOLATILE MEMORY CELLS

FIELD

The present invention relates to the field of non-volatile memory cells. More specifically, the present invention relates to methods, circuits and systems for reading non-volatile memory ("NVM") cells, including multilevel NVM cells.

BACKGROUND

The Field Effect Transistor

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals.

The terminals of a field effect transistor (FET) are commonly named source, gate and drain. In the FET a small amount of voltage is applied to the gate in order to control current flowing between the source and drain. In FETs the main current appears in a narrow conducting channel formed near (usually primarily under) the gate. This channel connects electrons from the source terminal to the drain terminal. The channel conductivity can be altered by varying the voltage applied to the gate terminal, enlarging or constricting the channel and thereby controlling the current flowing between the source and the drain.

FIG. 1 illustrates a FET 100 comprising a p-type substrate, and two spaced-apart n-type diffusion areas—one of which will serve as the "source", the other of which will serve as the "drain" of the transistor. The space between the two diffusion areas is the "channel". A thin dielectric layer is disposed over the substrate in the neighbourhood of the channel, and a "gate" structure is disposed over the dielectric layer atop the channel. (The dielectric under the gate is also commonly referred to as "gate oxide" or "gate dielectric".) Electrical connections (not shown) may be made to the source, the drain, and the gate. The substrate may be grounded.

Generally, when there is no voltage on the gate, there is no electrical conduction (connection) between the source and the drain. As voltage (of the correct polarity) is applied to the gate, there is a "field effect" in the channel between the source and the drain, and current can flow between the source and the drain, and can be controlled by the voltage applied to the gate. In this manner, a small signal (gate voltage) can control a relatively large signal (current flow between the source and the drain).

The Floating Gate Transistor

A floating gate transistor is generally a transistor structure, broadly based on the FET, as described hereinabove. As illustrated in FIG. 2, the floating gate transistor 200 has a source and a drain, but rather than having only one gate, it has two gates which are called control gate (CG) and floating gate (FG). It is this arrangement of control gate and floating gate which enables the floating gate transistor to function as a memory cell, as described hereinbelow.

The floating gate is disposed over tunnel oxide (comparable to the gate oxide of the FET). The floating gate is a conductor, the tunnel oxide is an insulator (dielectric material). Another layer of oxide (interpoly oxide, also a dielectric material) separates the floating gate from the control gate.

Since the floating gate is a conductor, and is surrounded by dielectric material, it can store a charge. Electrons can move around freely within the conductive material of the floating gate (which comports with the basic definition of a "conductor").

Since the floating gate can store a charge, it can exert a field effect on the channel region between the source and the drain, in a manner similar to how a normal FET works, as described hereinabove. Mechanisms for storing charges on the floating gate structure, as well as removing charges from the floating gate are described hereinbelow.

Generally, if a charge is stored on the floating gate, this represents a binary "1". If no charge is stored on the floating gate, this represents a binary "0". (These designations are arbitrary, and can be reversed so that the charged state represents binary "0" and the discharged state represents binary "1".) That represents the programming "half" of how a floating gate memory cell operates. The other half is how to determine whether there is a charge stored on the floating gate—in other words, to "read" the memory cell. Generally, this is done by applying appropriate voltages to the source, drain and gate terminals, and determining how conductive the channel is. Some modes of operation for a floating gate memory cell are described hereinbelow.

Normally, the floating gate non-volatile memory (NVM) cell has only a single "charge-storing area"—namely, the conductive floating gate (FG) structure, and can therefore only store a single bit of information (binary "1" or binary "0"). More recently, using a technology referred to as "multilevel cell" (MLC), two or more bits can be stored in and read from the floating gate cell by programming the cell to more than 2 levels.

The NROM Memory Cell

Another type of memory cell, called a "nitride, read only memory" (NROM) cell, has a charge-storage structure which is different from that of the floating gate memory cell and which permits charges to be stored in two separate charge-storage areas. Generally, the two separate charge storage areas are located within a non-conductive layer disposed between the gate and the underlying substrate, such as a layer of nitride formed in an oxide-nitride-oxide (ONO) stack underneath the gate. The non-conductive layer acts as a charge-trapping medium. Generally, electrical charges will stay where they are put in the charge-trapping medium, rather than being free to move around as in the example of the conductive floating gate of the floating gate memory cell. A first bit of binary information (binary "1" or binary "0") can be stored in a first portion (such as the left-hand side) of the charge-trapping medium, and a second bit of binary information (binary "1" or binary "0") can be stored in a second portion (such as the right-hand side) of the charge-trapping medium. An alternative viewpoint is that different charge concentrations can be considered for each bit of storage. Using MLC technology, at least two bits can be stored in and read from each of the two portions (charge storage areas) of the charge-trapping medium (for a total of 4 bits), similarly 3 bits or more than 4 bits may be identified.

FIG. 3 illustrates a basic NROM memory cell 300, which may be viewed as an FET with an "ONO" structure (or "stack") 321 inserted between the gate and the substrate. (One might say that the ONO structure is "substituted" for the gate oxide of the FET.)

The ONO structure is a stack (or "sandwich") of bottom (lower) oxide 322, a charge-trapping material such as nitride 324 (for example: silicon nitride material), and a top (upper) oxide 326. The ONO structure may have an overall thickness of approximately 10-25 nm, such as 18 nm, as follows:

the bottom oxide layer 322 may be from 3 to 6 nm, for example 4 nm thick;

the middle nitride layer 324 may be from 3 to 8 nm, for example 4 nm thick; and the top oxide layer 326 may be from 5 to 15 nm, for example 10 nm thick.

The NROM memory cell has two spaced apart diffusions 314 and 316 (which can function as source and drain, as discussed hereinbelow), and a channel region 320 defined in the substrate between the two diffusion regions 314 and 316, and a gate 328 disposed above the ONO stack 321.

In FIG. 3, the diffusions are labeled "N+". This means that they are regions in the substrate that have been doped with an electron donor material, such as phosphorous or arsenic. These diffusions are typically created in a larger region which is p-type cell well (CW) doped with boron (or indium or both). This is the normal "polarity" for an NVM cell employing electron injection (but which may also employ hole injection, such as for erase). With opposite polarity (boron or indium implants in an n-type cell well), the primary injection mechanism would be for holes, which is generally accepted to be not as effective as electron injection. One skilled in the art will recognize that the concepts disclosed herein can be applied to opposite polarity devices.

The charge-trapping material 324 is non-conductive, and therefore, although electrical charges can be stored in the charge-trapping material, they are not free to move around, they will generally stay where they are stored. Nitride is a suitable charge-trapping material. Charge trapping materials other than nitride may also be suitable for use as the charge-trapping medium. One such material is silicon dioxide with buried polysilicon islands or buried Nitride islands, or metal islands, or amorphous silicon islands, and so forth. A layer (324) of silicon dioxide with polysilicon islands would be sandwiched between the two layers of oxide (322) and (326). Alternatively, the charge-trapping layer 324 may be constructed by implanting an impurity, such as Silicon, into a layer of silicon dioxide deposited on top of the bottom oxide 322.

The memory cell 300 is generally capable of storing at least two bits of data—at least one bit(s) in a first storage area of the nitride layer 324 represented by the dashed circle 323, and at least one bit(s) in a second storage area of the nitride layer 324 represented by the dashed circle 321. Thus, the NROM memory cell can be considered to comprise two "half cells", each half cell capable of storing at least one bit(s). It should be understood that a half cell is not a physically separate structure from another half cell in the same memory cell. The term "half cell", as it may be used herein, is used herein only to refer to the "left" or "right" bit storage area of the ONO stack (nitride layer). The storage areas 321, 323 may variously be referred to as "charge storage areas", "charge trapping areas", and the like, throughout this document. (The two-charge storage areas may also be referred to as the right and left "bits".)

Each of the storage areas 321, 323 in the charge-trapping material 324 can exert a field effect on the channel region 320 between the source and the drain, in a manner similar to how a normal FET works, as described hereinabove (FIG. 2).

Generally, if a charge is stored in a given storage area of the charge-trapping material, this represents a binary "1", and if no charge is stored in a given storage area of the charge-trapping material, this represents a binary "0". (Again, these designations are arbitrary, and can be reversed so that the charged state represents binary "0" and the discharged state represents binary "1".) That represents the programming "half" of how an NROM memory cell operates. The other half is how to determine whether there is a charge stored in a given storage area of the charge-trapping material—in other words, to "read" the memory cell. Generally, this is done by applying appropriate voltages to the diffusion regions (functioning as source and drain) and gate terminals, and determining how conductive the channel is.

Generally, one feature of NROM cells is that rather than performing "symmetrical" programming and reading, NROM cells are beneficially programmed and read "asymmetrically", which means that programming and reading occur in opposite directions. The arrows labeled in FIG. 3 are arranged to illustrate this point. Programming may be performed in what is termed the "forward" direction and reading may be performed in what is termed the "opposite" or "reverse" direction.

"Reading" an NROM Cell

Reading an NROM memory cell may involve applying voltages to the terminals of the memory cell comparable to those used to read a floating gate memory cell, but reading may be performed in a direction opposite to that of programming. Generally, rather than performing "symmetrical" programming and reading (as is the case with the floating gate memory cell, described hereinabove), the NROM memory cell is usually programmed and read "asymmetrically", meaning that programming and reading occur in opposite directions. This is illustrated by the arrows in FIG. 3. Programming is performed in what is termed the forward direction and reading is performed in what is termed the opposite or reverse direction. For example, generally, to program the right storage area 323 (in other words, to program the right "bit"), electrons flow from left (source) to right (drain). To read the right storage area 323 (in other words, to read the right "bit"), voltages are applied to cause electrons to flow from right to left, in the opposite or reverse direction. For example, generally, to program the left storage area 321 (in other words, to program the left "bit"), electrons flow from right (source) to left (drain). To read the left storage area 321 (in other words, to read the left "bit"), voltages are applied to cause electrons to flow from left to right, in the opposite or reverse direction. See, for example, U.S. Pat. No. 6,768,165.

Memory Array Architecture, Generally

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

As discussed hereinabove, each memory cell comprises a first diffusion (functioning as source or drain), a second diffusion (functioning as drain or source) and a gate, each of which has to receive voltage in order for the cell to be operated, as discussed hereinabove. Generally, the first diffusions (usually designated "source") of a plurality of memory cells are connected to a first bit line which may be designated "BL(n)", and second diffusions (usually designated "drain") of the plurality of memory cells are connected to a second bit line which may be designated "BL(n+1)". Typically, the gates of a plurality of memory cells are connected to common word lines (WL).

The bitlines may be "buried bitline" diffusions in the substrate, and may serve as the source/drain diffusions for the memory cells. The wordlines may be polysilicon structures and may serve as the gate elements for the memory cells.

FIG. 4 illustrates an array of NROM memory cells (labeled "a" through "i") connected to a number of word lines (WL) and bit lines (BL). For example, the memory cell "e" has its gate connected to WL(n), its source (left hand diffusion) is connected to BL(n), and its drain (right hand diffusion) is connected to BL(n+1). The nine memory cells illustrated in FIG. 4 are exemplary of many millions of memory cells that may be resident on a single chip.

Notice, for example that the gates of the memory cells "e" and "f" (to the right of "e") are both connected to the same word line WL(n). (The gate of the memory cell "d" to the left of "e" is also connected to the same word line WL(n).) Notice also that the right hand terminal (diffusion) of memory cell "e" is connected to the same bit line BL(n+1) as the left-hand terminal (diffusion) of the neighboring memory cell "f". In this example, the memory cells "e" and "f" have two of their three terminals connected together.

The situation of neighboring memory cells sharing the same connection—the gates of neighboring memory cells being connected to the same word line, the source (for example, right hand diffusion) of one cell being connected to the drain (for example left hand diffusion) of the neighboring cell—is even more dramatically evident in what is called "virtual ground architecture" wherein two neighboring cells actually share the same diffusion. In virtual ground array architectures, the drain of one memory cell may actually be the same diffusion which is acting as the source for its neighboring cell. Examples of virtual ground array architecture may be found in U.S. Pat. Nos. 5,650,959; 6,130,452; and 6,175,519, incorporated in their entirety by reference herein.

Additional Background Information

FIG. 1 (FET), FIG. 2 (floating gate) and FIG. 3 (NROM), above, are somewhat stylised, omitting various common elements for the sake of illustrative clarity.

For example, a thin layer of metal salicide, such as cobalt silicide or titanium silicide or nickel salicide, may be formed atop the gate structure, and atop the source and drain diffusions (or two "agnostic" diffusions of an NROM cell). A dielectric layer may then be disposed over the entire device, to support upper level metalization such as wiring patterns, interconnects, word lines and bitlines which pass between several devices, as well as to external circuitry (not shown). This dielectric layer may be referred to as an inter level dielectric (ILD) layer.

Contacts must be opened through the ILD, to access the metal silicide, and effect contact with the gate (such as 328) and the two diffusions (such as 314 and 316). With reference to the diffusions, it is particularly important that, in the process of creating the contact, the underlying diffusion is not damaged. It is thereby known, and is common practice to first form a capping layer over the device, and said capping layer may act as an etch stop layer when etching the ILD to form the contacts.

NROM is one type of NVM cell commonly using a nitride charge trapping layer with an ONO stack structure. Data may be written in such memory cells by charging or discharging the nitride charge-trapping layer (such as 324, FIG. 3). Programming may involve injecting electrons into the charge-trapping layer, which increases the threshold voltage. Erasing may involve neutralizing the electrons, such as with hot hole injection (HHI), into the charge-trapping layer, which decreases the threshold voltage.

Commonly-owned patents disclose structure and operation of NROM and related ONO memory cells. Some examples may be found in commonly-owned U.S. Pat. Nos. 5,768,192 and 6,011,725, 6,649,972 and 6,552,387.

Commonly-owned patents disclose architectural aspects of an NROM and related ONO array, (some of which have application to other types of NVM array) such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array or the like. Some examples may be found in commonly-owned U.S. Pat. Nos. 6,233,180, and 6,448,750.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer. Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM. Some examples may be found in commonly-owned U.S. Pat. Nos. 6,954,393 and 6,967,896.

A more complete description of NROM and similar ONO cells and devices, as well as processes for their development may be found at "Non Volatile Memory Technology", 2005 published by Saifun Semiconductor and materials presented at and through http://siliconnexus.com, both incorporated by reference herein in their entirety.

Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon) and the like used for NVM devices. Further description of NVM and related technologies may be found at "Non Volatile Memory Technology", 2005 published by Saifun Semiconductor; "Microchip Fabrication", by Peter Van Zant, 5$^{th}$ Edition 2004; "Application-Specific Integrated Circuits" by Michael John Sebastian Smith, 1997; "Semiconductor and Electronic Devices", by Adir Bar-Lev, 2$^{nd}$ Edition, 1999; "Digital Integrated Circuits" by Jan M. Rabaey, Anantha Chandrakasan and Borivoje Nikolic, 2$^{nd}$ Edition, 2002 and materials presented at and through http://siliconnexus.com, "Design Considerations in Scaled SONOS Nonvolatile Memory Devices" found at http://klabs.org/richcontent/MemoryContent/nvmt_symp/nvmts_2000/presentations/bu_white_sonos_lehigh_univ.pdf, "SONOS Nonvolatile Semiconductor Memories for Space and Military Applications" found at http://klabs.org/richcontent/MemoryContent/nvmt_symp/nvmts_2000/papers/adams_d.pdf, "Philips Research—Technologies—Embedded Nonvolatile Memories" found at: http://www.research.philips.com/technologies/ics/nvmemories/index.html, and "Semiconductor Memory: Non-Volatile Memory (NVM)" found at: http://www.ece.nus.edu.sg/stfpage/elezhucx/myweb/NVM.pdf, all of which are incorporated by reference herein in their entirety.

Glossary

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

Anisotropic literally, one directional. An example of an anisotropic process is sunbathing. Only surfaces of the body exposed to the sun become tanned. (see "isotropic").

Bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page". That is the "mathematical" definition of "bit". In some cases, the actual (physical) left and right charge storage areas of a NROM cell are conveniently referred to as the left "bit" and the right "bit", even though they may store more than one binary bit (with MLC, each storage area can store at least two binary bits). The intended meaning of "bit" (mathematical or physical) should be apparent from the context in which it is used.

Bit line or bitline (BL). A conductor connected to (or which may actually be) the drain (or source) of a memory cell transistor.

Byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, for example, kilobyte (KB), megabyte (MB) and gigabyte (GB).

Cap a term used to describe layers of a material disposed over another, dissimilar material, typically to protect the underlying material from damage during subsequent processing steps. A cap may be left in place, or removed, depending upon the situation.

Cell Well (CW) the cell well is an area in the silicon substrate that is prepared for functioning as a transistor or memory cell device by do ping with an electron acceptor material such as boron or indium (p, electron acceptors or holes) or with an electron donor material such as phosphorous or arsenic (n, electron donors). The depth of a cell well is defined by the depth of the dopant distribution.

CHEI short for channel hot electron injection, sometimes abbreviated "CHE".

CHISEL short for channel initiated secondary electron mechanism.

CMOS short for complementary-metal oxide semiconductor. CMOS consists of n-channel and p-channel MOS transistors. Due to very low power consumption and dissipation as well as minimization of the current in "off" state, CMOS is a very effective device configuration for implementation of digital functions. CMOS is a key device in state-of-the-art silicon microelectronics.

CMOS Inverter: A pair of two complementary transistors (a p-channel and an n-channel) with the source of the n-channel transistor connected to the drain of the p-channel one and the gates connected to each other. The output (drain of the p-channel transistor) is high whenever the input (gate) is low and the other way round. The CMOS inverter is the basic building block of CMOS digital circuits.

NMOS: n-channel CMOS.

PMOS: p-channel CMOS.

CMP short for chemical-mechanical polishing. CMP is a process, using both chemicals and abrasives, comparable to lapping, for removing material from a built up structure, resulting in a particularly planar resulting structure.

Dopant element introduced into semiconductor to establish either p-type (acceptors) or n-type (donors) conductivity; common dopants in silicon: p-type, boron, B, Indium, In; n-type phosphorous, P, arsenic, As, antimony, Sb.

EEPROM short for electrically erasable, programmable read only memory. EEPROMs have the advantage of being able to selectively erase any part of the chip without the need to erase the entire chip and without the need to remove the chip from the circuit. The minimum erase unit is 1 Byte and more typically a full Page. While an erase and rewrite of a location appears nearly instantaneous to the user, the write process is usually slightly slower than the read process; the chip can usually be read at full system speeds.

EPROM short for erasable, programmable read only memory. EPROM is a memory cell in which information (data) can be erased and replaced with new information (data).

Erase a method to erase data on a large set of bits in the array, by applying a voltage scheme that inject holes or remove electrons in the bit set. This method causes all bits to reach a low Vt level.

FET short for field effect transistor. The FET is a transistor that relies on an electric field to control the shape and hence the conductivity of a "channel" in a semiconductor material. FETs are sometimes used as voltage-controlled resistors. The terminals of FETs are called gate, drain and source.

Flash memory Flash memory is a form of non-volatile memory (EEPROM) that can be electrically erased and reprogrammed. Flash memory architecture allows multiple memory locations to be erased or written in one programming operation.

FN tunneling Field emission—also called Fowler-Nordheim tunneling—is the process whereby electrons tunnel through a barrier in the presence of a high electric field. This quantum mechanical tunneling process is an important mechanism for thin barriers as those in metal-semiconductor junctions on highly-doped semiconductors. Using FN tunneling, electrons can be moved to the floating gate of a MOSFET memory cell.

Half cell this term is sometimes used to refer to the two distinct charge storage areas (left and right bits) of an NROM memory cell.

HHI short for hot hole injection

Isotropic literally, identical in all directions. An example of an isotropic process is dissolving a tablet in water. All exposed surfaces of the tablet are uniformly acted upon. (see "anisotropic")

Mask a layer of material which is applied over an underlying layer of material, and patterned to have openings, so that the underlying layer can be processed where there are openings. After processing the underlying layer, the mask may be removed. Common masking materials are photoresist and nitride. Nitride is usually considered to be a "hard mask".

MLC short for multi-level cell. In the context of a floating gate (FG) memory cell, MLC means that at least two bits of information can be stored in the memory cell. In the context of an NROM memory cell, MLC means that at least four bits of information can be stored in the memory cell—at least two bits in each of the two charge storage areas.

(Remark: I propose to define MLC as more than 2 analog levels in each memory site (FG has one site, NROM has 2 sites))

MOS short for metal oxide semiconductor.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSETs).

Nitride commonly used to refer to silicon nitride (chemical formula Si3N4). A dielectric material commonly used in integrated circuit manufacturing. Forms an excellent mask (barrier) against oxidation of silicon (Si). Nitride is commonly used as a hard mask or, in the case of a NVM memory cell having an ONO layer as a charge-trapping material. (Remark: sometimes silicon nitride chemical formula is not exactly Si3N4, the 3 and 4 might be 3.5 or 4.2 for example, thus it is known that the term Nitride includes them all)

n-type semiconductor in which concentration of electrons is higher than the concentration of "holes". See p-type.

NROM sometimes used as an abbreviation for nitride read only memory.

NVM short for non-volatile memory. NVM is computer memory that can retain the stored information even when not powered. Examples of non-volatile memory include read-only memory, flash memory, most types of magnetic computer storage devices (for example, hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of an NVM memory cell is a simple light switch. Indeed, such a switch can be set to one of two (binary) positions, and "memorize" that position.)

ONO short for oxide-nitride-oxide. ONO is used as a charge storage insulator consisting of a sandwich of Oxide, then nitride then oxide.

Oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films are obtained by thermal oxidation of silicon. Thermal SiO2 forms a smooth, low-defect interface with Si, and can be also readily deposited by chemical vapor deposition (CVD). Some particular applications of oxide are:

LV Oxide short for low voltage oxide, the oxide used for gate of low voltage CMOS devices.

HV Oxide short for high voltage oxide, the oxide used for gate of high voltage CMOS devices.

STI Oxide short for shallow trench oxide. Oxide-filled trenches are commonly used to separate one region (or device) of a semiconductor substrate from another region (or device)

Poly short for polycrystalline silicon (Si). Heavily doped poly Si is commonly used as a gate contact in silicon metal oxide semiconductor (MOS) and complementary metal oxide semiconductor (CMOS) devices;

p-type semiconductor in which concentration of "holes" is higher than the concentration of electrons. See n-type. Examples of p-type silicon include silicon doped (enhanced) with boron (B), Indium (In) and the like.

Program a method to program memory cells, or half cells, typically by applying a voltage scheme that injects electrons to increase the Vt of the cells or half cells being programmed.

PROM short for programmable read-only memory.

RAM short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design.

Read a method to read the digital data stored in a memory cell.

Resist short for photoresist. Also abbreviated "PR". Photoresist is often used as a masking material in photolithographic processes to reproduce either a positive or a negative image on a structure, prior to etching (removal of material which is not masked). PR is usually washed off after having served its purpose as a masking material.

ROM short for read-only memory.

SEI short for secondary electron injection (or simply "secondary injection"). SEI occurs as a result of impact ionization by CHE electrons (e1) near the drain diffusion, generating an electron-hole pair (e2-h2), the hole (h2) of which continues into the substrate whereat another impact ionization results in another electron-hole pair (e3-h3), and the e3 electron becomes injected into the charge storage area(s) of the memory cell.

Si Silicon, a semiconductor.

SLC short for single level cell. In the context of a floating gate (FG) memory cell, SLC means that one bit of information can be stored in the memory cell. In the context of an NROM memory cell, SLC means that two bits of information can be stored in the memory cell, each bit at one site: left site and right site.

Site charge storage region

SONOS Si-Oxide-Nitride-Oxide-Si, another way to describe ONO with the Si underneath and the Poly gate on top.

Spacer a spacer, as the name implies, is a material (such as a layer of oxide) disposed on an element (such as a poly gate electrode). For example, sidewall spacers disposed on sides of a gate electrode cause subsequent implants to occur further away from the gate than otherwise (without the spacers in place).

STI short for shallow trench isolation

TEHH short for Tunnel Enhanced Hot Hole injection. TEHH is an "injection mechanism".

Units of Length Various units of length may be used herein, as follows:

meter (m) A meter is the SI unit of length, slightly longer than a yard.

1 meter=~39 inches. 1 kilometer (km)=1000 meters=~0.6 miles.

1,000,000 microns=1 meter. 1,000 millimeters (mm) 1 meter. 100 centimeters (cm)=1 meter.

micron (μm) one millionth of a meter (0.000001 meter); also referred to as a micrometer.

mil 1/1000 or 0.001 of an inch; 1 mil=25.4 microns.

nanometer (nm) one billionth of a meter (0.000000001 meter).

Angstrom (Å) one tenth of a billionth of a meter. 10 Å=1 nm.

Voltage abbreviated v, or V. A voltage can be positive or negative (or zero). Usually, a negative voltage is preceded by a minus sign (−). Sometimes a positive voltage is preceded by a plus sign (+), or no sign at all. A number of voltages are relevant with regard to operating a memory cell, and are typically designated by the capital letter "V", followed by another letter or letters. Some exemplary voltages of interest are:

KeV short for kilo (thousand) electron volts

Vt short for threshold voltage

Vs short for source voltage

Vd short for drain voltage

Vg short for gate voltage

Vbl short for bitline voltage. (the bitline may function as source or drain)

Vwl short for wordline voltage (which typically is the same as Vg)

Word line or wordline; (WL). A conductor normally connected to the gate of a memory cell transistor. The wordline may actually be the gate electrode of the memory cell.

Write a combined method, usually involving first erasing a large set of bits, then programming new data into the bit set; the erase step is not required but it is customary.

In addition to the above, some abbreviations that may be used herein, or in a provisional application from which this non-provisional application claims priority, include:

ILD short for inter-layer (or inter-level) dielectric, typically oxide.

IMD short for inter-metal dielectric, typically oxide.

RAC short for retention after cycling

Gm relates to transconductance (analogous to, gain)

DVde delta Vde drain erase voltage gate fixed, negative

STI short for shallow trench isolation

Ld short for (channel) length drawn

ANL short for ANneaL

Issues Relating to Programming & Reading

Generally, the logical state of an NVM cell is defined by its threshold voltage ("VT"), the voltage value which when applied to the NVM cell's gate populates the cell's channel with a sufficient number of charge carriers to enable the cell's channel to conduct current. In cases where the NVM cell is a multi-charge storage region device, each charge storage/trapping region may have its own associated VT, where the VT for a given charge storage/trapping region may be defined as the voltage that when applied to the gate terminal of the device causes sufficient numbers of carriers near the Source, to populate a segment of the device's channel, near and beneath the charge storage region, so as to allow current to flow through the given channel segment. With most multi-charge storage devices, the charge storage regions are located on either side of the storage layer, and their respective channel segments are located beneath the charge storage regions, very near the junctions on either end of the channel. Various methods for operating (for example, programming, reading and erasing) an NVM cells is known, but generally a cell's or a charge storage region's (as in the case of multi-charge storage region devices) VT, which defines a logical state, is regulated by either injecting or removing charge from it's the relevant charge storage/trapping region.

FIG. 5A shows a voltage distribution graph depicting a correlation between an exemplary NVM cell's (from this point onward, the term cell will also apply to the each charge storage regions of a multi-charge storage region's cell) voltage threshold level VT and the exemplary cell's logical state. The threshold voltage distributions shown are for an ideal binary non-volatile memory cell, wherein vertical lines of the graph depict boundary threshold voltage values between the binary NVM cell's possible logical states and the cone shaped curves depict ideal probabilistic VT distributions of the NVM cell's VT either after programming or after erasing. For example: (1) when the cell's threshold voltage VT is determined to be below an Erase Verified ("EV") voltage level, the cell's logical state is "Erased" (for example, logical "1"); (2) when the cell's threshold voltage VT level is above a Program Verified ("PV") voltage level, the cell's logical state is "Programmed (for example, logical "0").

According to the ideal distribution shown in graph FIG. 5A, VT of an ideal NVM cell should always be below EV or above PV. However, due to various phenomena that may cause the threshold voltage of a cell to fluctuate or drift, up or down, an intermediate threshold level which takes into account VT fluctuations, such as a Read Verify ("RV") level (also shown in FIG. 5A) may be used during the reading of an NVM cell. More specifically, when the cell's VT level is above RV, the cell may be considered as "programmed", and when the cell's threshold voltage level is below the RV level, the cell may be considered as in the "erased" state.

FIG. 5B shows an extension of the binary NVM cell scenario of FIG. 5A, where the voltage distribution graph depicts possible threshold voltage distributions associated with different logical states of a multi-level non-volatile memory cell ("MLC"), wherein one set of vertical lines depicts boundary values correlated with each of the cell's possible Program Verify Threshold Voltages (PV00, PV01, and so forth) and another set of vertical lines depict boundary values correlated with the Read Verify level of each of the cell's possible Program states (RV00, RV01, and so forth). As opposed to binary cells where each charge storage region is able to store only one bit (that is, 0 or 1), MLC cells may store two or more bits per charge storage region (for example, 00, 01, 11 and 10) by partitioning the full range of possible Vt values (for example, 0 to 12 volts) associated with a given charge storage region into a multiplicity of sub-ranges, wherein each sub-range is associated with a separate logical state, as depicted in FIG. 5B. The larger the number of sub-ranges into which an MLC cell's total Threshold Voltage range is partitioned, the narrower the sub-ranges associated with each state must be, which reduces the cells tolerance for Threshold voltage fluctuations or drift. Whereas, if the VT on a programmed binary NVM cell drifts 1 volt below PV, the VT will still most likely be above the cell's RV level, because there will most likely be enough margin between the cells EV and PV value. However, in an MLC NVM cell, the different between EV or PV associated with one of the logical states and the RV associated with the next logical state is usually no more than a volt or so, and VT fluctuation or drift of only 1 volt may cause a cell programmed to a given logical state to be improperly read as having a VT associated with a different logical state.

FIGS. 6A & 6B show possible Threshold Voltage distributions of actual NVM cells, binary and MLC, after some period of operation or some amount of erase/program cycling. As evident from these graphs, it is possible for both binary and MLC cells to experience VT drift sufficient to cause the cells' VT to fall below a relevant RV level. This phenomenon and the issues it presents have been addressed in several ways, one of which is to determine or adjust the RV levels of a group of cells prior to reading the cells. Such techniques may be generally characterized as "moving reference level" techniques. U.S. Pat. Nos. 7,257,025; 7,242,618; and 6,992,932, commonly owned with the present application, each describe methods and circuits by which to adjust RV levels to compensate for VT drift. FIGS. 7A & 7B show voltage distribution diagrams for NMV cells, binary and MLC, illustrating how RV levels associated with a logical state may be adjusted to compensate for VT drift which is sufficiently great that it would result in a read error had the logical states RV level been fixed. The teachings of these patents are hereby incorporated into the present application by reference in their entirety.

As NVM cells are cycled over and over, their VT distributions may spread both upward and downward. Wear on an NVM cell results in the cell becoming more difficult to accurately program (for example, a single pulse may over-program the cell), and once programmed, the cell may be less able to retain charge, thus result in large downward VT drift. Thus, after some period of time and/or number of cycles, an NVM cell may have a VT distribution similar to those shown in FIG. 8A or 8B. As visible from FIGS. 8A and 8B, the VT distribution spread may cause an upper VT limit of a cell's lower logical state to overlap with the lower VT limit of the cell's adjacent higher logical state, in which event a moving or adjustable RV level scheme alone will not be able to distinguish between the lower and the higher logical states. This situation eventually causes binary data corruption.

It should be understood by one of ordinary skill in the art that the preceding and proceeding discussions relating to the operation of a cell also apply to the operation of each charge storage region of a multi-charge storage region cell or device.

There is a need in the field of NVM for a method, circuit and system to read and/or recover the logical state of an NVM cell, binary or MLC, whose logical state VT distributions have overlapped.

SUMMARY

The present disclosure includes methods, circuits and systems for reading non-volatile memory ("NVM") cells, including multi-level NVM cells. According to some embodiments of the present disclosure, there may be provided an NVM cell threshold voltage detection circuit adapted to detect an approximate threshold voltage associated with a charge storage region of a NVM cell, where the NVM cell may be a single or a multi-charge storage region cell. A decoder circuit may be adapted to decode and/or indicate the logical state of an NVM cell charge storage region by mapping or converting a detected approximate threshold voltage of the charge storage region into a logical state value. According to some embodiments of the present disclosure, mapping/converting performed by the decoder circuit may be based on a multifactor function, which multifactor function may take into account approximate threshold voltages of one or more charge storage regions in proximity with the charge storage region whose logical state is being decoded and/or indicated. According to some embodiments of the present disclosure, the multifactor function may take into account the approximate threshold voltages of a charge storage region residing on the same NVM cell as the charge storage region being decoded. According to further embodiments of the present disclosure, the multifactor function may take into account the approximate threshold voltages of a charge storage region residing on an NVM cell adjacent (for example, adjacent word-line or adjacent bit-line) to the cell on which resides the charge storage region being decoded.

According to some embodiments of the present disclosure, there may be provided a buffer for storing a set of approximate threshold values. The buffer may be populated with approximate threshold values read from a set of charge storage regions by a threshold voltage detection circuit. The threshold voltage detection circuit may include one or more sense amplifiers, one or more reference structures (for example, reference cells) and may be adapted to output an approximate threshold value for a charge storage region being read. Is should be understood by one of ordinary skill in the art that any circuit and/or methodology for determining or approximating the threshold voltage associated with an NVM cell's charge storage region, known today or to be devised in the future, may be applicable to the present disclosure. Is should also be understood that any memory buffer structure suitable for the above mentioned purpose, known today or to be devised in the future, may be applicable to the present disclosure.

According to some embodiments of the present disclosure, the approximate threshold voltage of a set of charge storage regions may be detected, in series or in parallel, prior to decoding the respective detected threshold voltages into corresponding logical state values. An NVM cell threshold voltage detection circuit may detect and optionally store in a buffer the approximate threshold voltage values of substantially each of a set of charge storage regions. The decoder circuit may read the stored threshold values and may use a multifactor function to convert approximate threshold voltage values into logical state values. For example, when decoding a first charge storage region into a logical state, the multifactor function may also factor in an approximate threshold voltage of a second charge storage region, which second charge storage region may reside either on the same NVM cell or on an adjacent NVM cell as the first charge storage region. More specifically, should the threshold voltage of the first charge storage region be approximated to be at a VT within overlapping threshold voltage distributions of two adjacent logical states, the multifactor function may also factor in the approximate threshold voltage of an adjacent charge storage region in determining whether the approximate VT of the first charge storage region should be decoded into the lower or the higher of the two adjacent logical states.

According to some embodiments of the present disclosure, the multifactor decoder (that is, decoder using multifactor function) may be adapted to recover data written to NVM cells whose logical state VT distributions have spread and overlapped. The multifactor decoder can be implemented as part of: (1) an NVM device's core control logic (that is, controller), (2) Error Correction Coding functionally coupled to the controller, or (3) as part of any circuit in the data read path of the NVM device.

According to further embodiments of the present disclosure, threshold voltages of NVM charge storage regions whose neighboring charge storage regions meet a specific condition (for example, neighboring charge storage region threshold voltage above a predefined threshold) may be read/decoded together. For example, within a set (for example, block) of NVM cells, the detection circuit may read/decode the approximate threshold voltages of only those charge storage regions in proximity with charge storage regions whose threshold voltages meet a predefined condition (for example, only read/decode a charge storage regions whose neighboring charge storage region on the same NVM cell has a threshold voltage above 6 volts). When selectively decoding charge storage regions, the decoder circuit may be: (1) a single factor function selected to correspond with the selection criteria of the read charge storage regions, or (2) a multifactor decoder using a multifactor function where one of the factors is fixed based on the selection criteria of the charge storage regions to be read/decoded.

BRIEF DESCRIPTION OF THE DRAWINGS

The subject matter regarded as the disclosure is particularly pointed out and distinctly claimed in the concluding portion of the specification The disclosure, however, both as to organization and method of operation, together with objects, features and advantages thereof, may best be understood by reference to the following non limiting detailed description when read with the accompanied drawings in which:

FIG. 4 shows an array of NROM memory cells (labeled "a" through "i") comprised of NVM cell connected to a number of word lines (WL) and bit lines (BL);

FIGS. 15A-15C show a set of "11" and "01" logical state threshold voltage distributions, including adjacent charge storage region dependent voltage distribution sub-regions.

Figure 1:
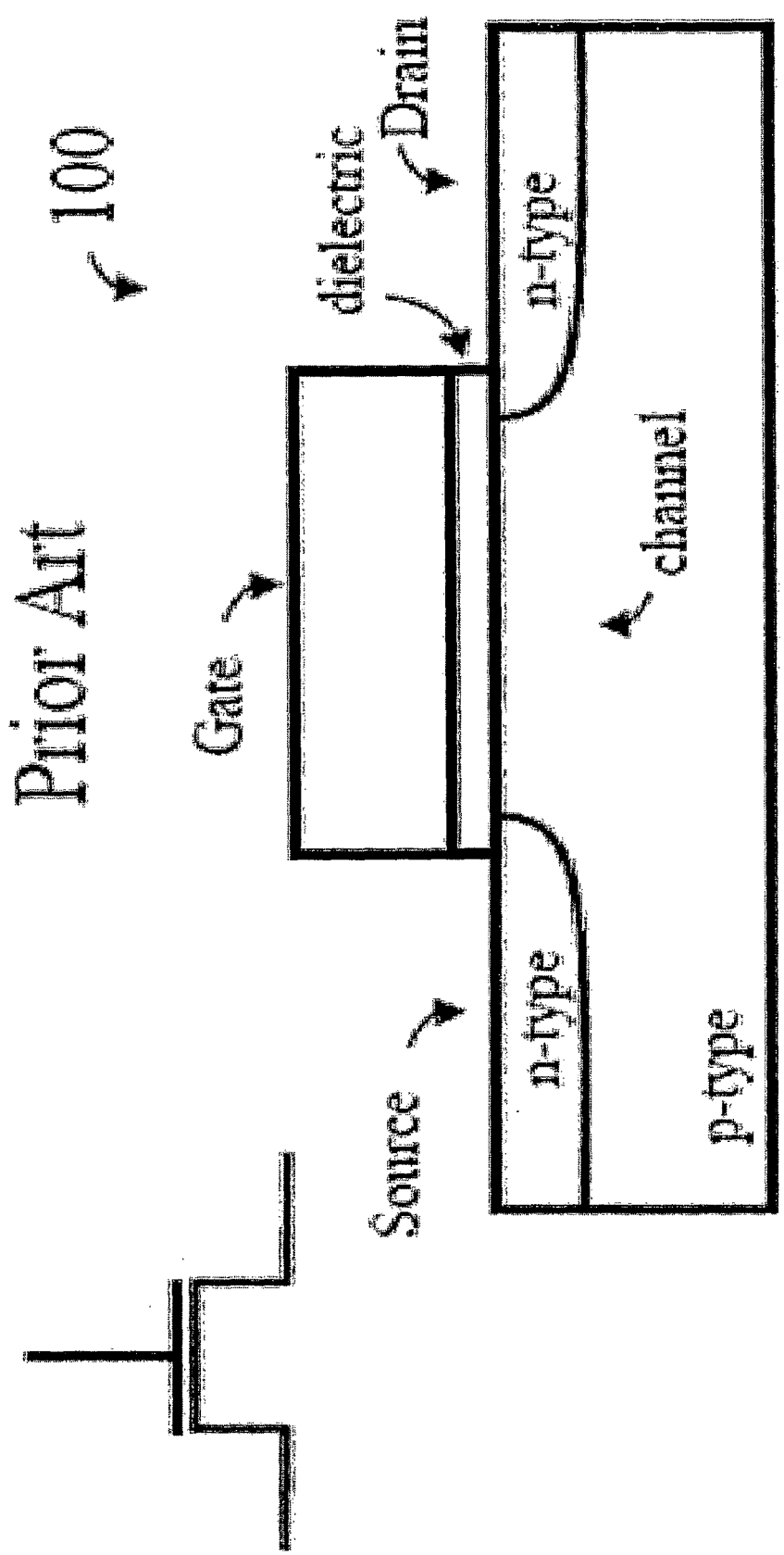
FIG. 1 shows a cross-section of a basic Field Effect Transistor ("FET") including a p-type substrate, and two spaced-apart n-type diffusion areas.
Figure 2:
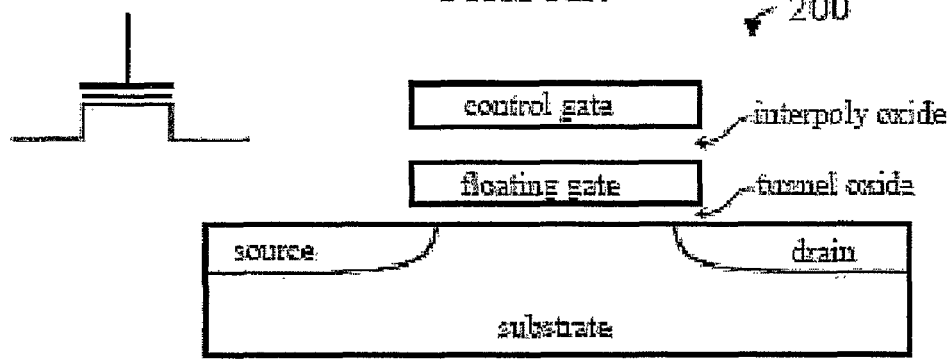
FIG. 2 shows a cross-section of a floating NVM cell including a source, a drain, a control gate (CG) and a floating gate (FG)
Figure 3:
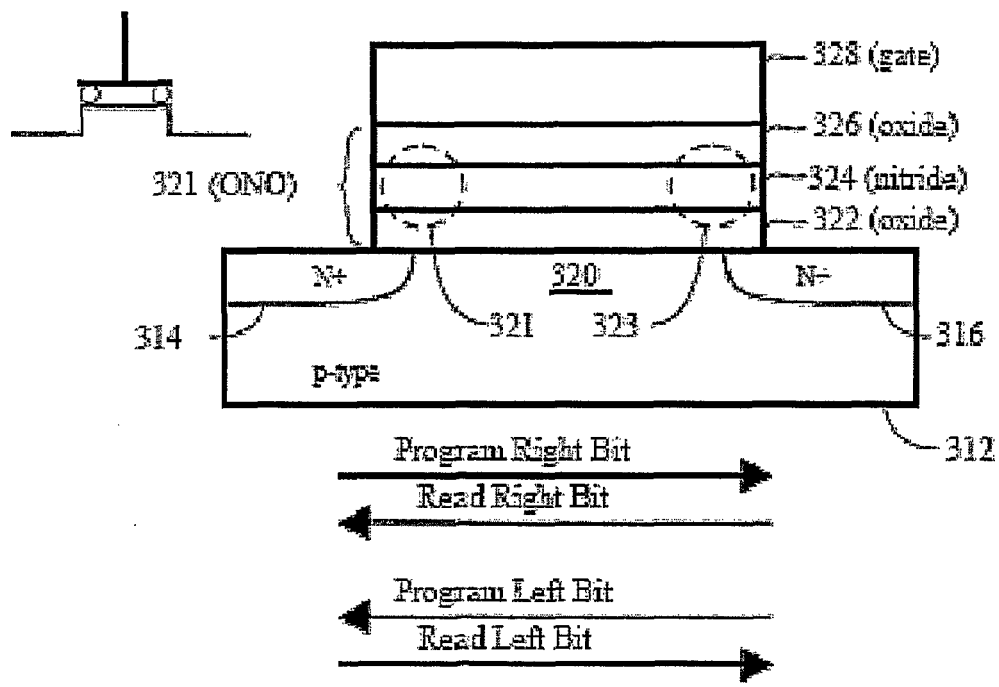
FIG. 3 shows a cross-section of a basic NROM memory cell, which cell may be viewed as an FET with an "ONO" structure (or "stack") inserted between the gate and the substrate.
Figure 5A:
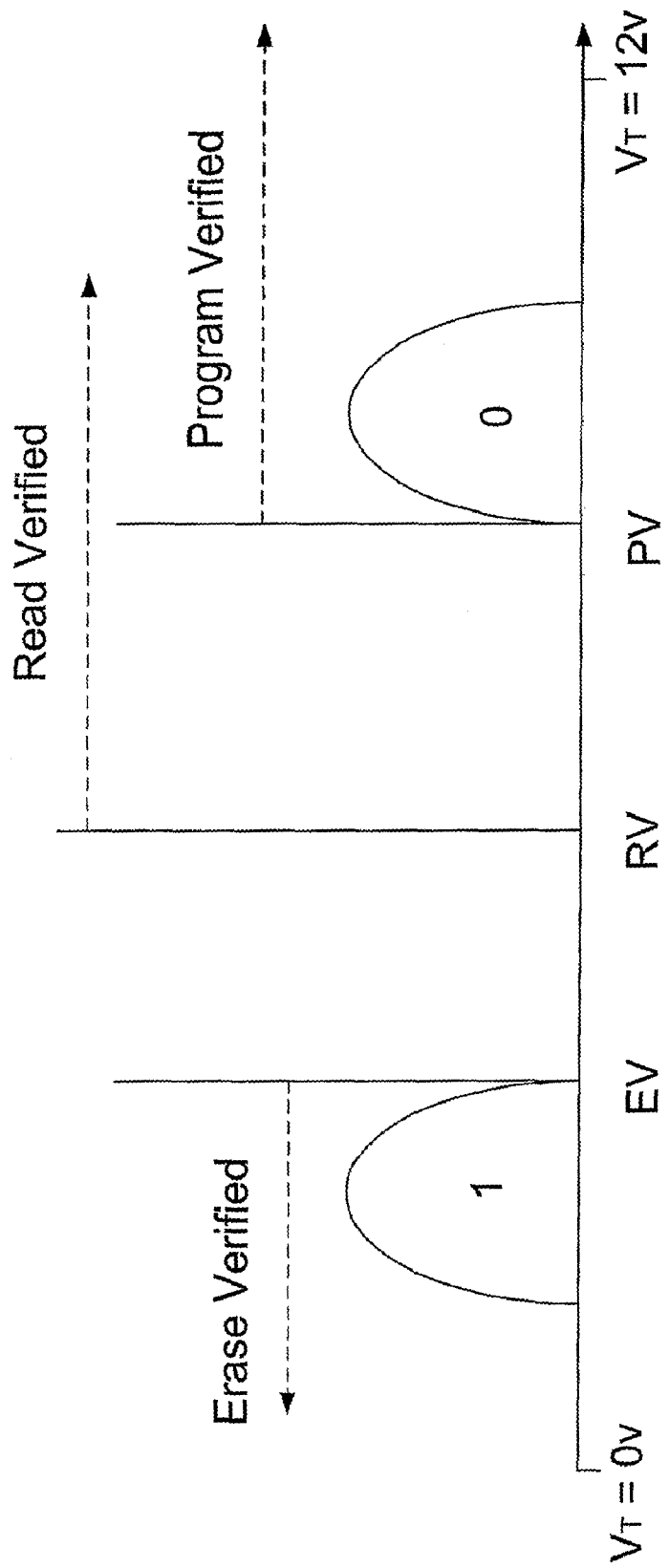
FIG. 5A shows an exemplary threshold voltage distribution graph for a binary NVM cell, including vertical lines indicating boundaries of voltage regions associated with different logical states of the cell, and ideal threshold voltage probability distributions indicated thereon.
Figure 5B:
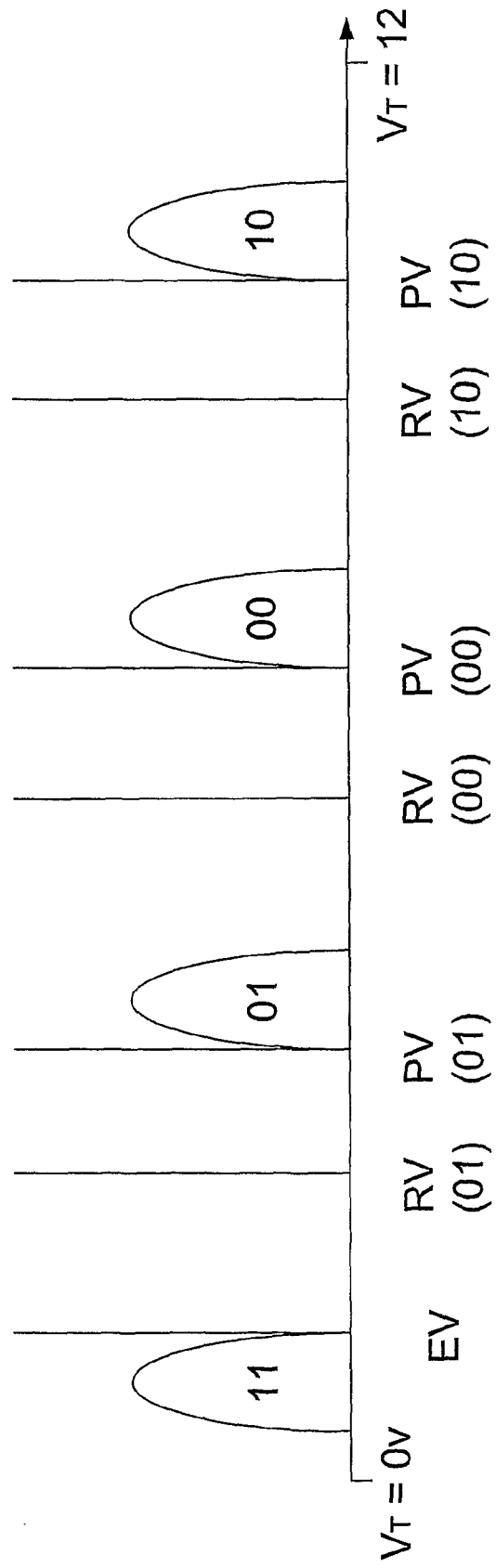
FIG. 5B shows an exemplary threshold voltage distribution graph for a multi-level NVM cell, including vertical lines indicating boundaries of voltage regions associated with different logical states of the cell, and ideal threshold voltage probability distributions indicated thereon.
Figure 6A:
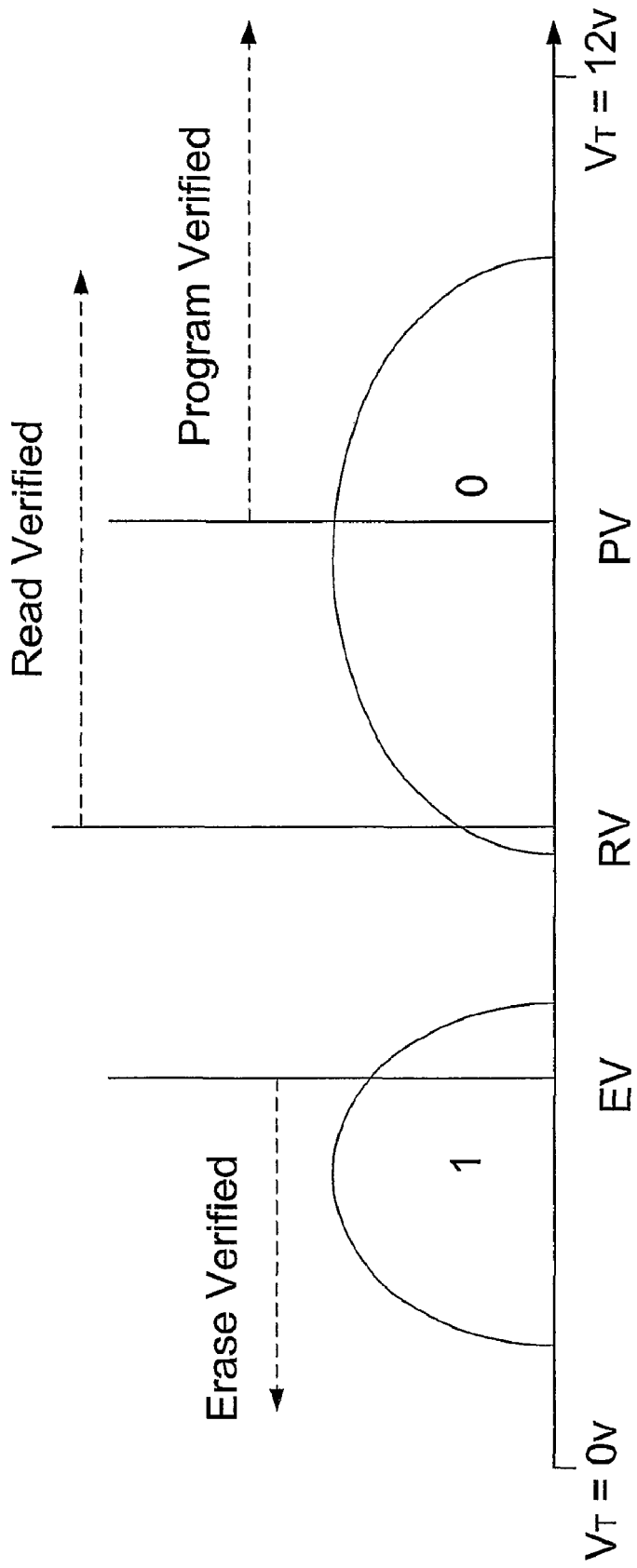
FIG. 6A shows an exemplary threshold voltage distribution graph for a binary NVM cell, including vertical lines indicating boundaries of voltage regions associated with different logical states of the cell, and threshold voltage probability distributions associated with threshold voltage drift or spreading which may occur after operation of the NVM cell.
Figure 6B:
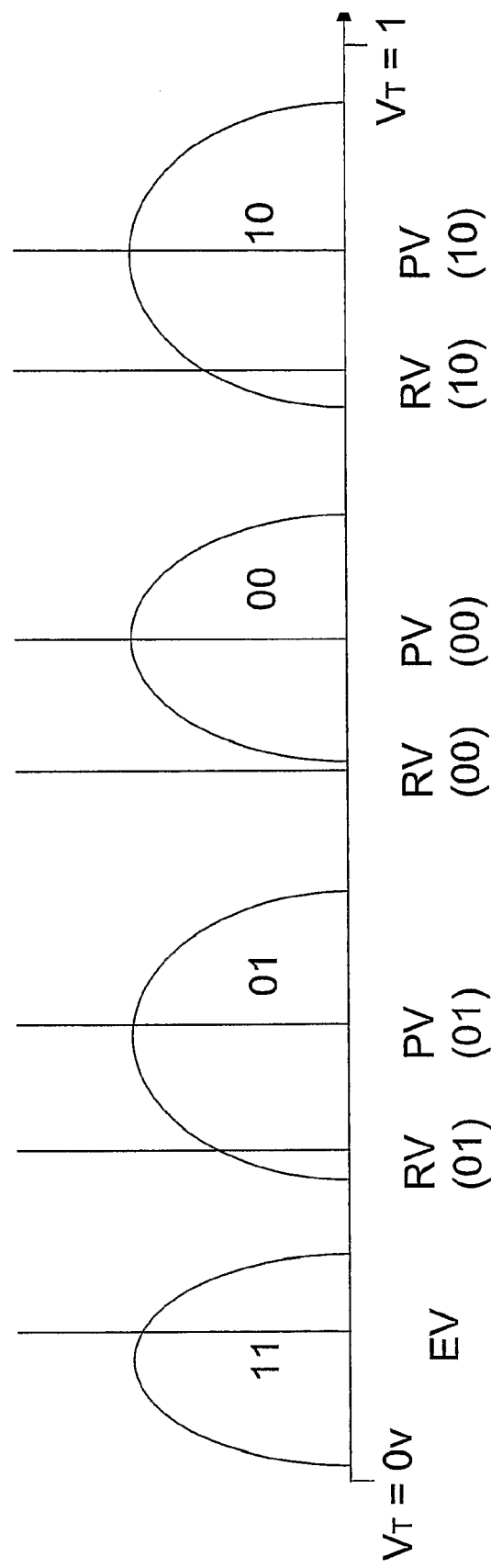
FIG. 6B shows an exemplary threshold voltage distribution graph for a multi-level NVM cell, including vertical lines indicating boundaries of voltage regions associated with different logical states of the cell, and threshold voltage probability distributions associated with threshold voltage drift or spreading which may occur after operation of the NVM cell.
Figure 7A:
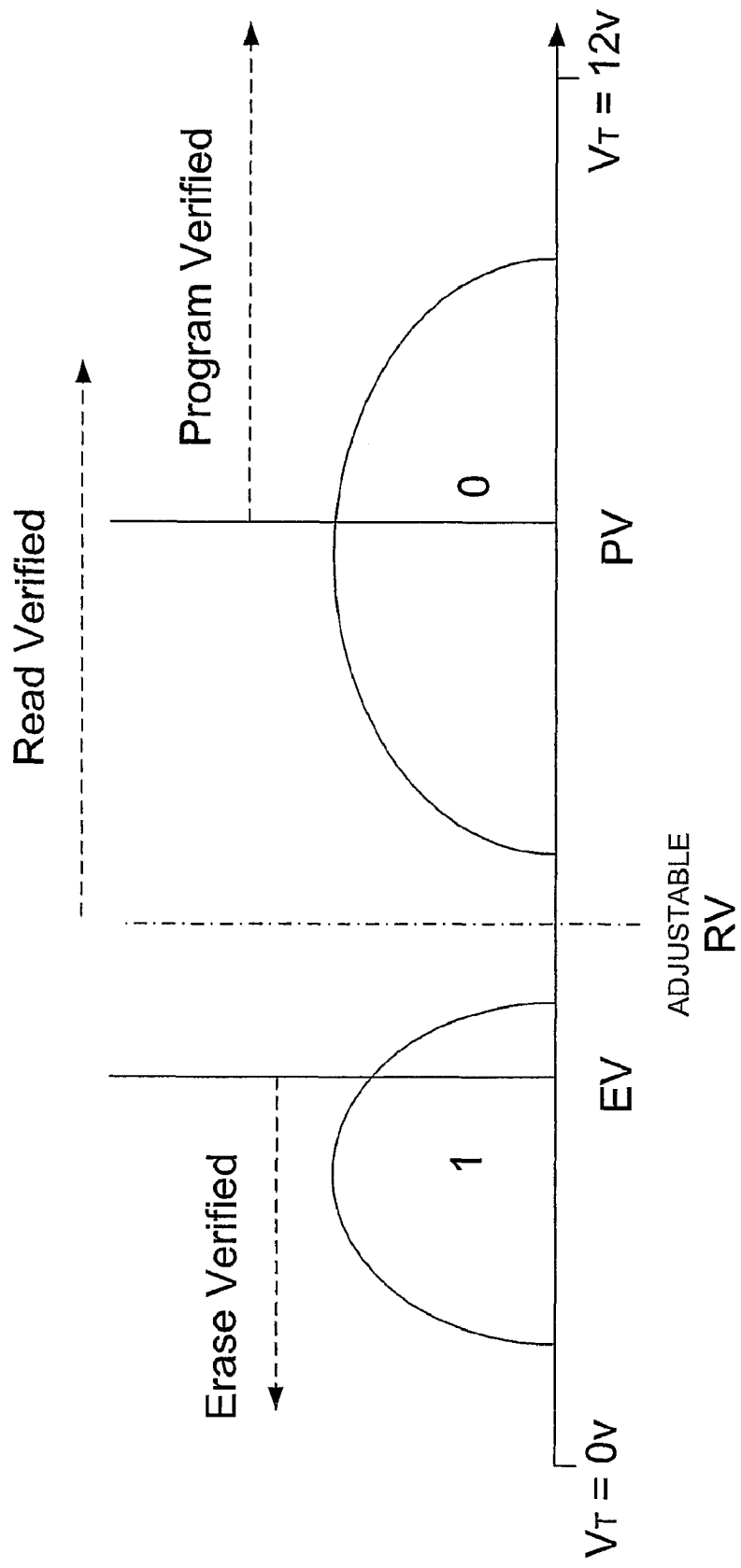
FIG. 7A shows an exemplary threshold voltage distribution graph for a binary NVM cell, including vertical lines indicating dynamically adjustable boundaries of voltage regions associated with different logical states of the cell.
Figure 7B:
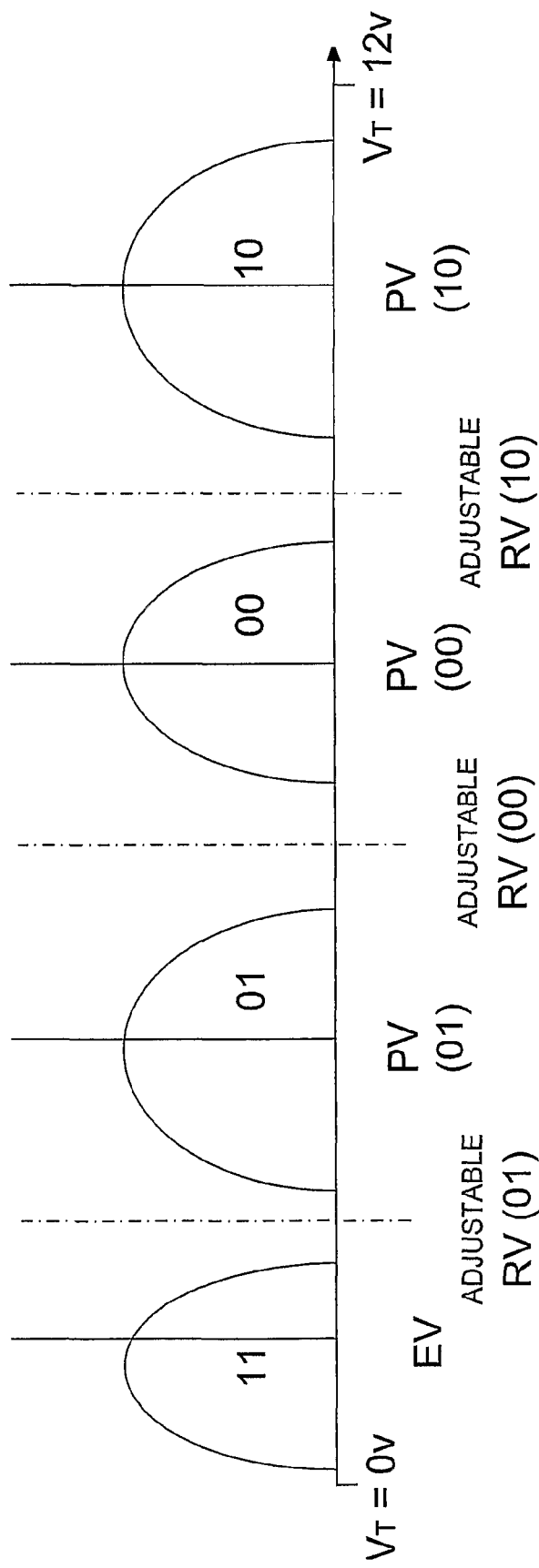
FIG. 7B shows an exemplary threshold voltage distribution graph for a multi-level NVM cell, including vertical lines indicating dynamically adjustable boundaries of voltage regions associated with different logical states of the cell.

It will be appreciated that for simplicity and clarity of these non-limiting illustrations, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the disclosure. However, it will be understood by those skilled in the art that the present disclosure may be practiced without these specific details. In other instances, well-known methods, procedures, components and circuits have not been described in detail so as not to obscure the present disclosure.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present disclosure are not described with reference to any particular programming language. It will be appreciated that a variety of programming languages may be used to implement the teachings of the inventions as described herein.

The present disclosure includes methods, circuits and systems for reading non-volatile memory ("NVM") cells, including multi-level NVM cells. According to some embodiments of the present disclosure, there may be provided a NVM cell threshold voltage detection circuit adapted to detect an approximate threshold voltage associated with a charge storage region of a NVM cell, where the NVM cell may be a single or a multi-charge storage region cell. A decoder circuit may be adapted to decode and/or indicate the logical state of a NVM cell charge storage region by mapping or converting a detected approximate threshold voltage of the charge storage region into a logical state value. According to some embodiments of the present disclosure, mapping/converting performed by the decoder circuit may be based on a multifactor function, which multifactor function may take into account approximate threshold voltages of one or more charge storage regions in proximity with the charge storage region whose logical state is being decoded and/or indicated. According to some embodiments of the present disclosure, the multifactor function may take into account the approximate threshold voltages of a charge storage region residing on the same NVM cell as the charge storage region being decoded. According to further embodiments of the present disclosure, the multifactor function may take into account the approximate threshold voltages of a charge storage region residing on an NVM cell adjacent (e.g. adjacent word-line or adjacent bit-line) to the cell on which resides the charge storage region being decoded.

According to some embodiments of the present disclosure, there may be provided a buffer for storing a set of approximate threshold values. The buffer may be populated with approximate threshold values read from a set of charge storage regions by a threshold voltage detection circuit. The threshold voltage detection circuit may include one or more sense amplifiers, one or more reference structures (for example, reference cells) and may be adapted to output an approximate threshold value for a charge storage region being read. Is should be understood by one of ordinary skill in the art that any circuit and/or methodology for determining or approximating the threshold voltage associated with an NVM cell's charge storage region, known today or to be devised in the future, may be applicable to the present disclosure. It should also be understood that any memory buffer structure suitable for the above-mentioned purpose, known today or to be devised in the future, may be applicable to the present disclosure.

According to some embodiments of the present disclosure, the approximate threshold voltage of a set of charge storage regions may be detected, in series or in parallel, prior to decoding the respective detected threshold voltages into corresponding logical state values. An NVM cell threshold voltage detection circuit may detect and optionally store in a buffer the approximate threshold voltage values of substantially each of a set of charge storage regions. The decoder circuit may read the stored threshold values and may use a multifactor function to convert approximate threshold voltage values into logical state values. For example, when decoding a first charge storage region into a logical state, the multifactor function may also factor in an approximate threshold voltage of a second charge storage region, which second charge storage region may reside either on the same NVM cell or on an adjacent NVM cell as the first charge storage region. More specifically, should the threshold voltage of the first charge storage region be approximated to be at a VT within overlapping threshold voltage distributions of two adjacent logical states, the multifactor function may also factor in the approximate threshold voltage of an adjacent charge storage region in determining whether the approximate VT of the first charge storage region should be decoded into the lower or the higher of the two adjacent logical states.

According to some embodiments of the present disclosure, the multifactor decoder (that is, decoder using multifactor function) may be adapted to recover data written to NVM cells whose logical state VT distributions have spread and overlapped. The multifactor decoder can be implemented as part of: (1) an NVM device's core control logic (that is, controller), (2) Error Correction Coding functionally coupled to the controller, or (3) as part of any circuit in the data read path of the NVM device.

According to further embodiments of the present disclosure, threshold voltages of NVM charge storage regions whose neighboring charge storage regions meet a specific condition (for example, neighboring charge storage region threshold voltage above a predefined threshold) may be read/decoded together. For example, within a set (for example, block) of NVM cells, the detection circuit may read/decode the approximate threshold voltages of only those charge storage regions in proximity with charge storage regions whose threshold voltages meet a predefined condition (for example, only read/decode a charge storage regions whose neighboring charge storage region on the same NVM cell has a threshold voltage above 6 volts). When selectively decoding charge storage regions, the decoder circuit may be: (1) a single factor function selected to correspond with the selection criteria of the read charge storage regions, or (2) a multifactor decoder using a multifactor function where one of the factors is fixed based on the selection criteria of the charge storage regions to be read/decoded.

Figure 8A:
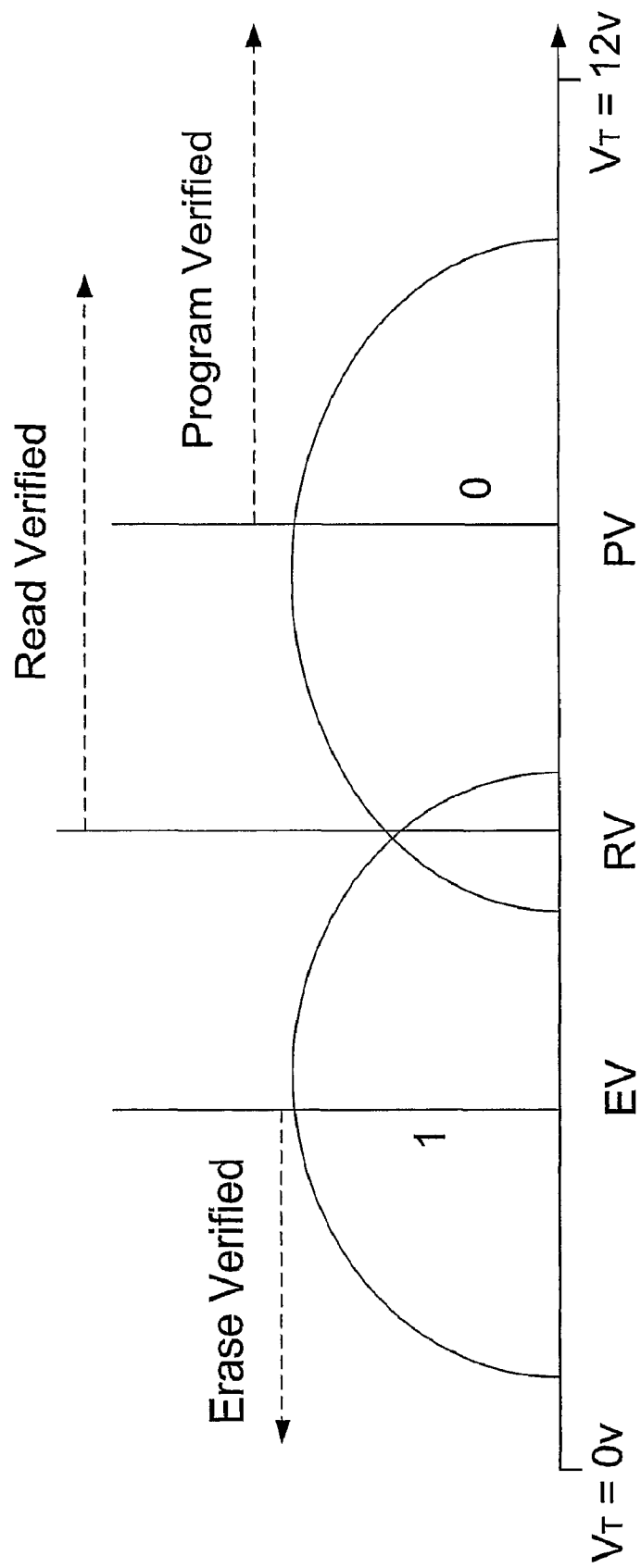
FIGS. 8A & 8B show exemplary threshold voltage distribution graphs for a binary and a multi-level NVM cell, respectively, including vertical lines indicating boundaries of voltage regions associated with different logical states of the cell, and threshold voltage probability distributions associated with threshold voltage drift/spreading which may occur in NVM cells after extensive operation of the NVM cell, wherein the threshold voltage distributions of adjacent logical states have spread to the point of overlapping and being unrecoverable.
Figure 8B:
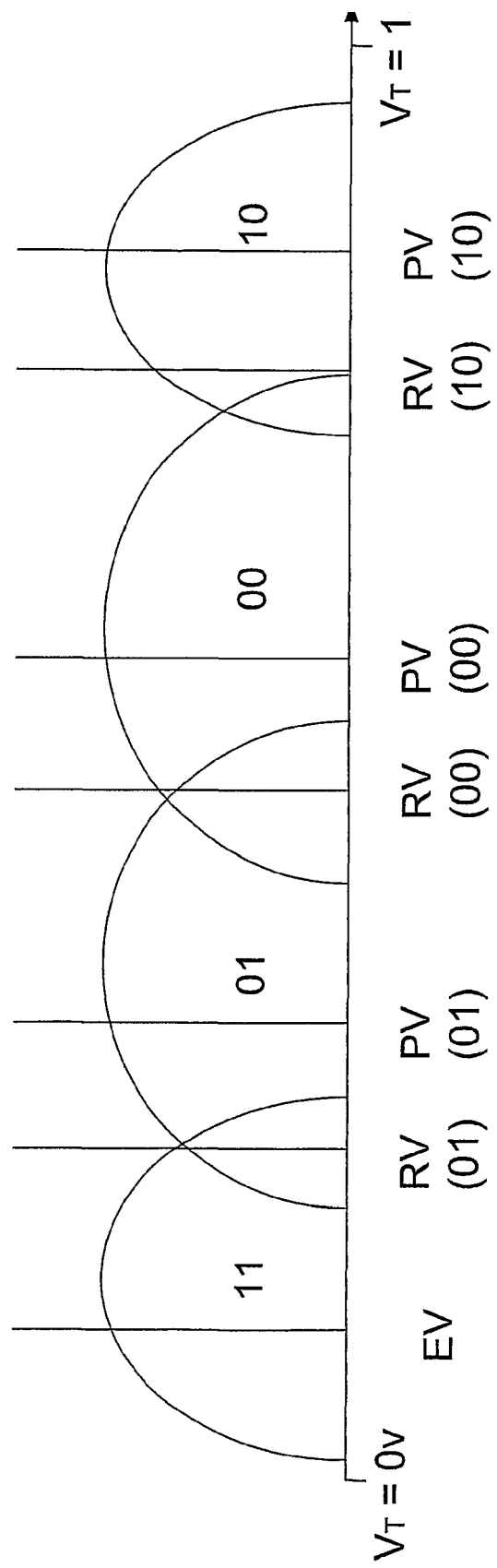
Figure 9:
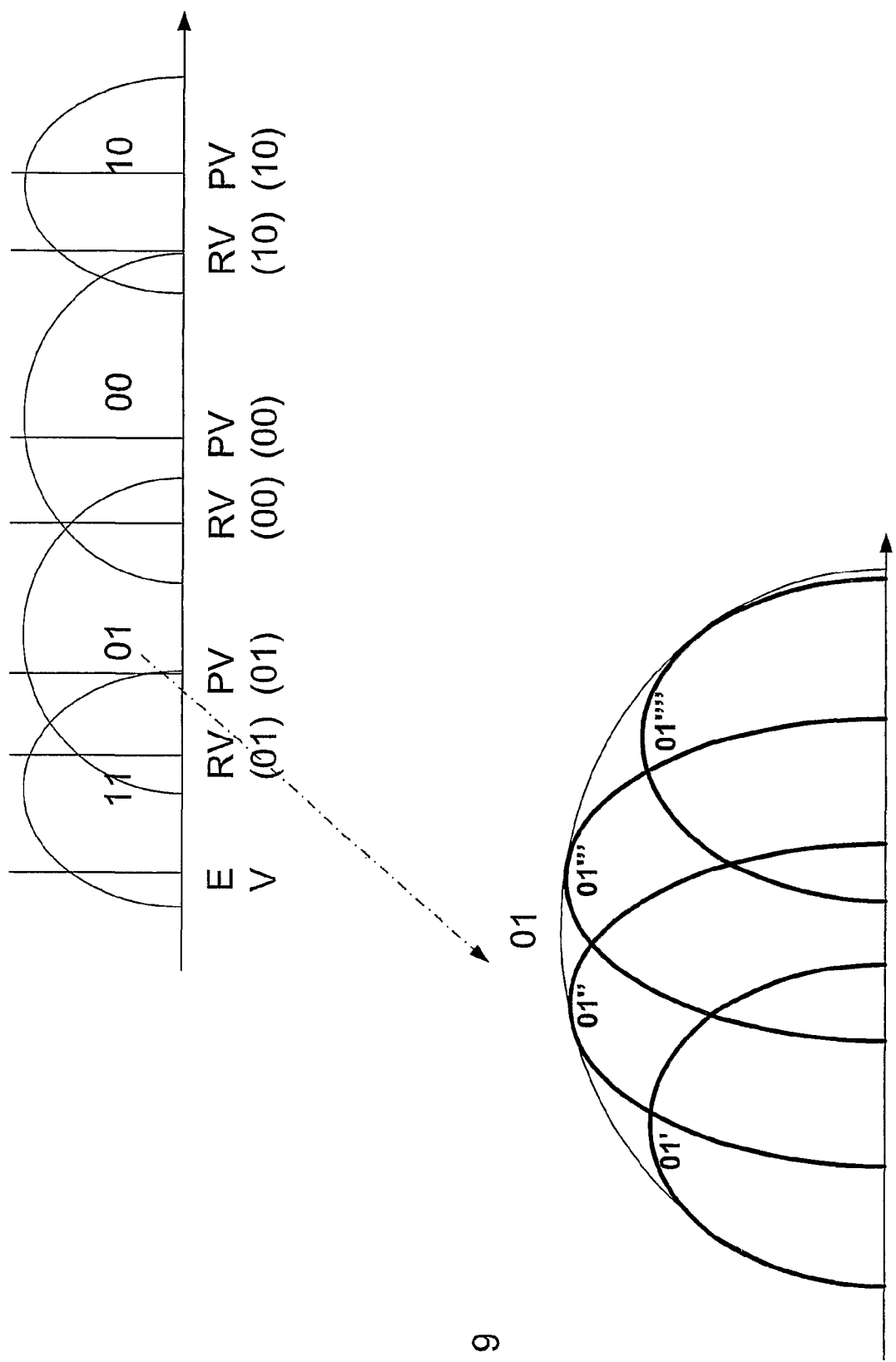
FIG. 9 shows a close-up of the "01" logical state threshold voltage distribution of FIG. 8B, also shown are adjacent charge storage region dependent voltage distribution sub-regions.

Turning now to FIG. 9, there is shown a close-up of the "01" logical state threshold voltage distribution of FIG. 8B. Also shown are adjacent charge storage region dependent voltage distribution sub-regions. It has been discovered by Applicant that within a probabilistic threshold voltage distribution associated with logical states of an NVM charge storage regions, there exist sub-regions or sub-distributions which are correlated to the threshold voltage of one or more adjacent NVM charge storage regions. More specifically, with reference to FIG. 9, if an NVM charge storage region has a probabilistic threshold voltage distribution as shown by the envelope designated as "01" in the upper portion of the figure, it has been discovered that the envelope/distribution may be composed of several smaller overlapping envelope/distributions (as shown in the lower left portion of FIG. 9), where each sub-region or sub-range of distributions may be correlated with a threshold voltage of an adjacent charge storage region. For example, if an NVM charge storage region has been programmed to logical state "01", according to FIG. 9, the storage region's threshold voltage value would most likely (for example, 99.9%) reside somewhere within the area defined by the larger envelope designated "01". It has been found that the storage region's threshold voltage value, as detectable by a reading circuit, will actually reside within one of a smaller sub-distribution envelope (01', 01", 01''' or 01""), similarly to what is illustrated in FIG. 9 (bottom), and in which sub-distribution envelope the threshold voltage value resides depends on the threshold voltage of an adjacent NVM charge storage region. Thus, if a threshold voltage of an adjacent NVM charge storage region (for example, a second storage region on the same NVM cell) is at or near a lower threshold voltage limit, the threshold voltage of the charge storage region programmed to the 01 state will most likely be within the 01' sub-distribution. If a threshold voltage of an adjacent NVM charge storage region (for example, a second storage region on the same NVM cell) is at or near a higher threshold voltage limit, the threshold voltage of the charge storage region programmed to the 01 state will most likely be within the 01"" sub-distribution. Neighboring threshold voltages in between the lower and higher limits should result in the 01 charge storage region's threshold voltage level being read within either sub-distribution 01" or 01''', in substantially direct correlation with the magnitude of the neighboring threshold voltage.

Figure 10:
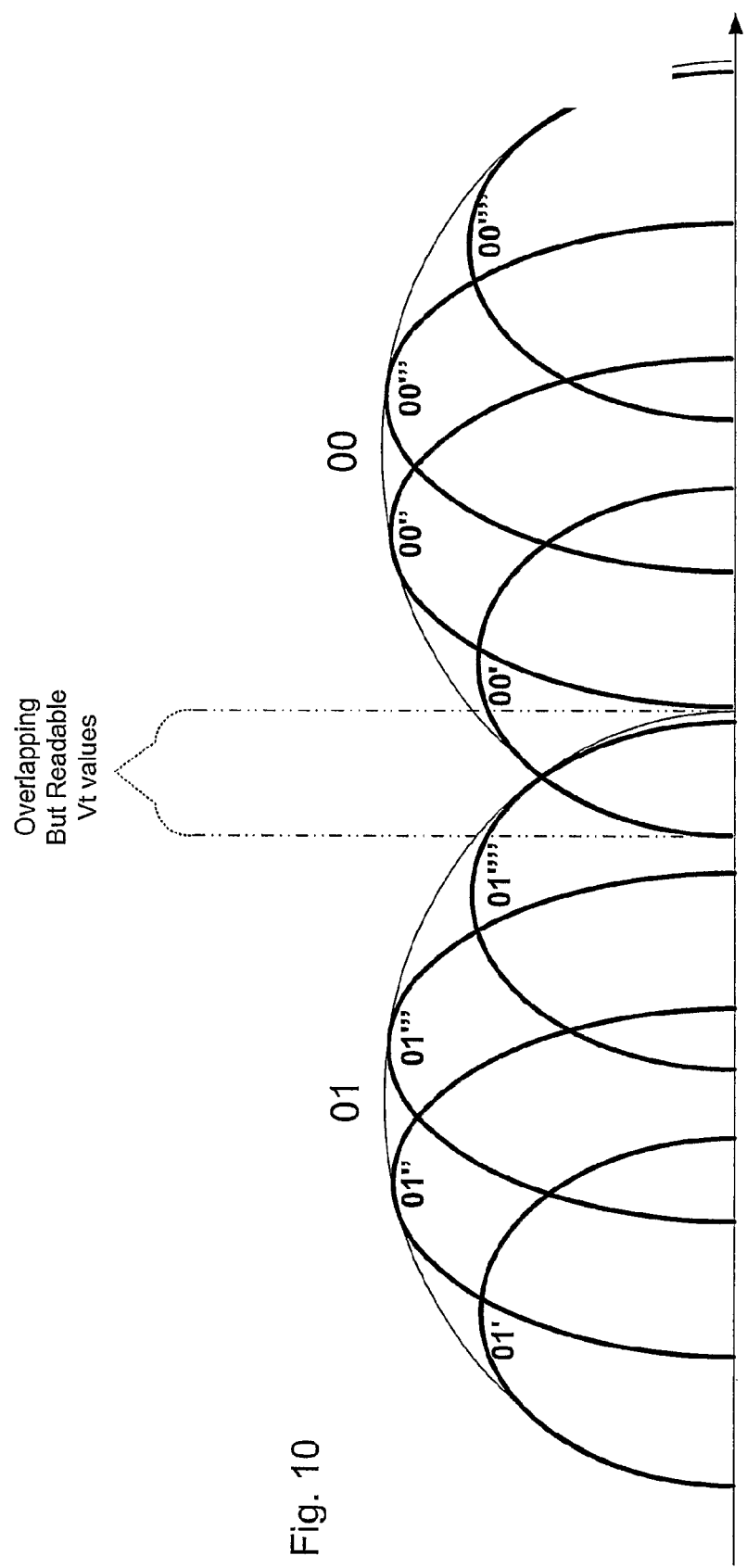
FIG. 10 shows a close-up of the "01" and "00" logical state threshold voltage distributions of FIG. 8B, also shown are the adjacent charge storage region dependent voltage distribution sub-regions of both logical states.
Figure 13:
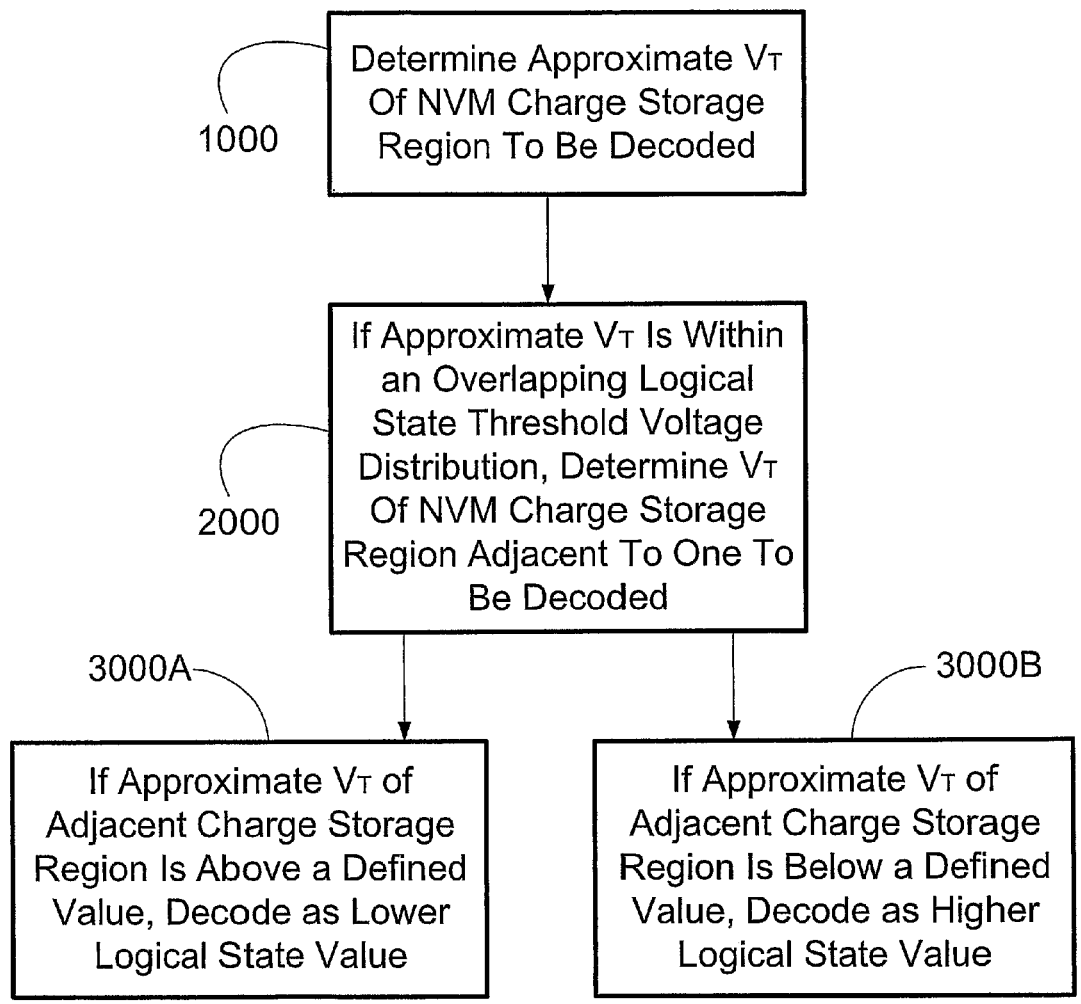
FIG. 13 shows a flow chart including the steps of a method of reading and decoding a charge storage region of a NVM cell according to some embodiments of the present disclosure.

Turning now to FIG. 10, there is shown a close-up of the "01" and "00" logical state threshold voltage distributions of FIG. 8B, also shown are the adjacent charge storage region dependent voltage sub-distributions or sub-regions of both logical states. As evident from FIG. 10, although threshold voltages of adjacent logical states on an NVM charge storage stream may spread to the point of overlapping, their respective sub-distribution may not overlap. This fact may be used to recover data stored to a given NVM charge storage region when the threshold voltage read from the given NVM charge storage region resides in the overlapping voltage range. FIG. 13 shows a flow chart including the steps of an exemplary method of reading and decoding a charge storage region of a NVM cell according to some embodiments of the present disclosure. The method includes: (1000) determining an approximate VT of a given NVM charge storage region to be decoded; (2000) If the approximate VT of the given charge storage region is within an overlapping logical state threshold voltage distribution, determine VT of NVM charge storage region adjacent to given charge storage region; (3000A+B) decode the given charge storage region by determining which sub-distribution is applicable based on adjacent charge storage region threshold. Thus, if the adjacent charge storage region has a relatively high threshold voltage, the relevant sub-distributions on FIG. 10 would be 01"" and 00"", and since 00"" is outside the approximated threshold voltage detected—01"" would be selected as the correct sub-distribution and 01 would be the decoded logical state. Conversely, if the adjacent charge storage region has a relatively low threshold voltage, the relevant sub-distributions on FIG. 10 would be 01' and 00', and since 01' is outside the approximated threshold voltage detected—00' would be selected as the correct sub-distribution and 00 would be the decoded logical state.

Figure 14:
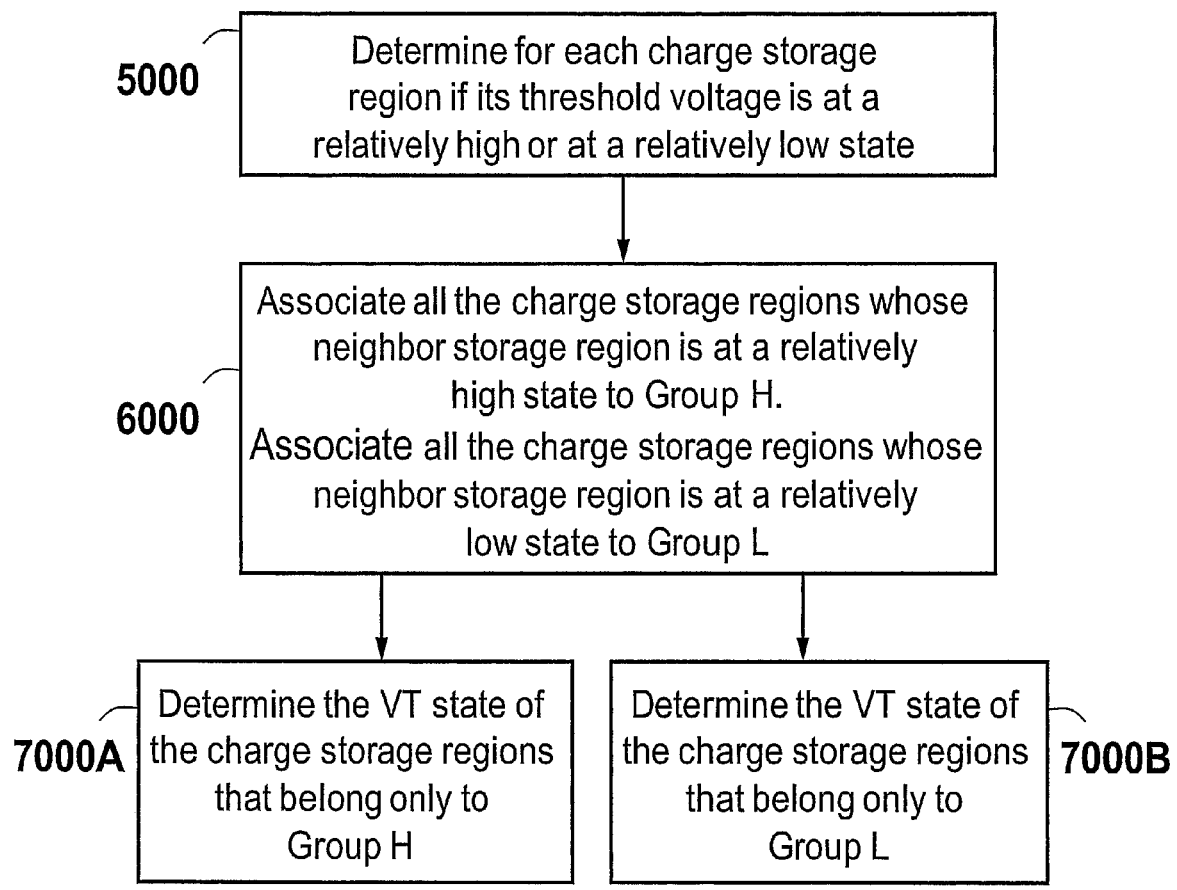
FIG. 14 shows a flow chart including the steps of another exemplary method of reading and decoding a charge storage region of a NVM cell according to some embodiments of the present disclosure.

FIG. 14 shows a flow chart including the steps of another exemplary method of reading and decoding a charge storage region of a NVM cell according to some embodiments of the present disclosure. The method includes: (5000) determining for each charge storage region if its threshold voltage is at a relatively high or at a relatively low state (for example, by comparing all the charge storage regions VT to a mid level reference voltage); (6000) Associate all the charge storage regions whose neighbor storage region is at a relatively high state to a first group (for example, Group H) and associate all the charge storage regions whose neighbor storage region is at a relatively low state to a second group (for example, Group L); (7000 A & B) Determine the VT state of the charge storage regions separately for those belonging to Group H and those belonging to group L. As discussed above, when decoding a set of charge storage regions whose neighboring charge storage region threshold voltage is known to be above or below a defined threshold, one may either use: (1) a decoding/mapping function selected to take into account the sub-region affect of the neighboring charge storage region, or (2) a multifactor decoding/mapping function with the factor relating to neighboring threshold voltage fixed based on the known condition of the neighboring charge storage region.

FIGS. 15A through 15C may assist in visualizing the exemplary method of FIG. 14. FIG. 15A shows a close-up of the "11" and "01" logical state threshold voltage distributions in a charge storage region whose logical states have spread to the point of overlapping. Also shown in FIG. 15A, are the sub-distributions of both logical states depending on the adjacent charge storage region state. Although threshold voltages of the adjacent logical states on an NVM charge storage stream may spread to the point of overlapping (as in FIG. 15A), it becomes evident from FIGS. 15B and 15C that when separately viewing/handling charge storage sub-regions or sub-distributions belonging to Group H and Group L, the overlapping is removed due to a contraction of the probability distributions, and stored data may be recovered based on sub-region or sub-distribution analysis, despite the fact that the overall distributions, "11" and "01", have overlapped.

Figure 11:
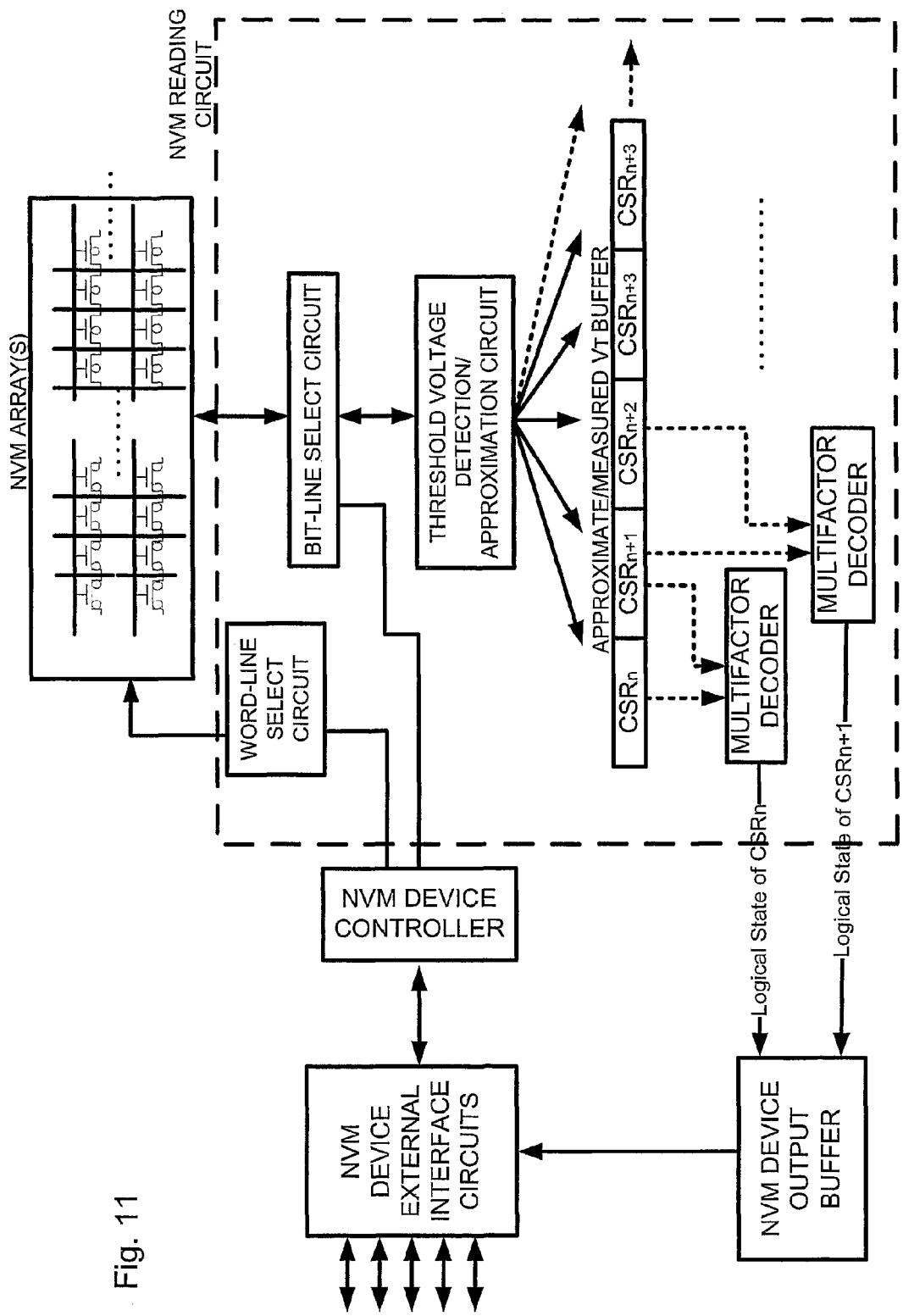
FIG. 11 shows a block diagram of a NVM device according to some embodiments of the present disclosure.
Figure 12:
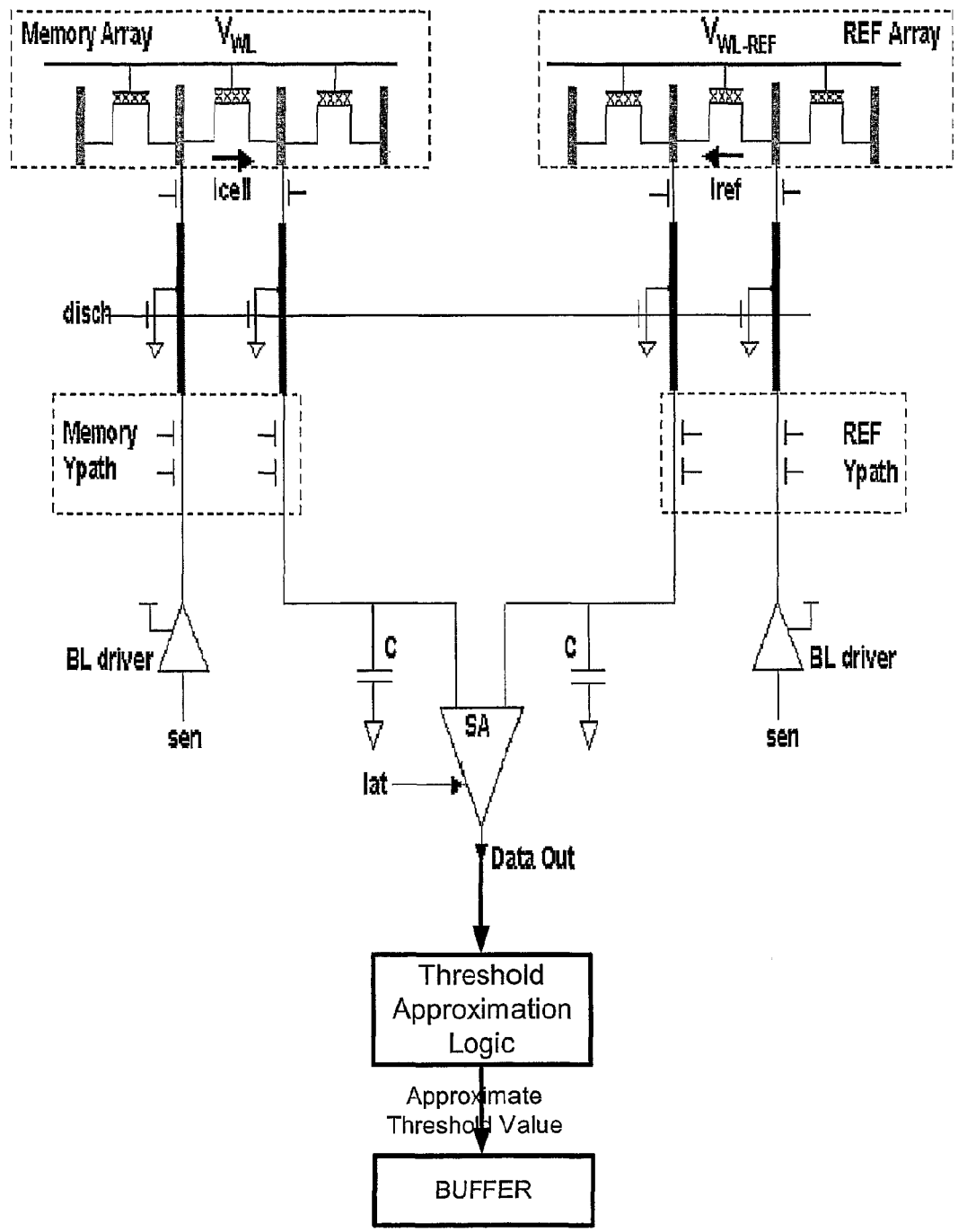
FIG. 12 shows a close-up of a portion of a NVM reading circuit according to some embodiments of the present disclosure.

Turning now to FIG. 11, there is shown a block diagram of an exemplary NVM device according to some embodiments of the present disclosure, which device may include circuits for reading and decoding NVM charge storage regions according to some embodiments of the present disclosure. The device includes a charge storage region reading circuit, such as the one shown in FIG. 12. It should be understood by one of ordinary skill in the art that any circuit known today or to be devised in the future capable of approximating the VT of a charge storage region would be applicable to the present disclosure. A buffer may store the approximate VT values of two or more charge storage regions in proximity with one another. One or more multifactor decoders may read the VT value of charge storage region being decoded, and may read the VT of an adjacent charge storage region when needed, as described above.

It is additionally noted that herein are described specific operations and applications of the present disclosure, however, it is apparent to those skilled in the arts that there are equivalent methods which are applicable substitutes, and therefore covered within the principles of the present disclosure. It will be appreciated by persons skilled in the art that the present disclosure is not limited to what has been particularly shown and described hereinabove. Rather the scope of the present disclosure is defined by the claims which follow.

The invention claimed is:

1. A non-volatile memory ("NVM") cell charge storage region reading circuit comprising:
   a threshold voltage detection circuit to determine an approximate threshold voltage of a first NVM cell charge storage region to be decoded; and
   a multifactor function of a decoder circuit to determine, when said approximate threshold voltage is within an overlapping logical state threshold voltage distribution, the logical state of said first charge storage region from the threshold voltage of a second charge storage region adjacent to said first charge storage region.

2. A non-volatile memory ("NVM") cell charge storage region reading circuit comprising:
   a threshold voltage detection circuit to determine an approximate threshold voltage of a first NVM cell charge storage region to be decoded; and
   a multifactor function of a decoder circuit to use, when said approximate threshold voltage is within an overlapping logical state threshold voltage distribution, an approximate threshold voltage of an adjacent charge storage region as a differentiator to determine the logical state of said first storage region.

3. The circuit according to claim 1 and wherein said decoder circuit comprises a charge decoder to decode the threshold voltage of said first charge storage region as a lower logical value if the approximate threshold voltage of said second charge storage region is above a defined value and as a higher logical value if the approximate threshold voltage of said second charge storage region is below a defined value.

4. The reading circuit according to either claim 1 or 2, further comprising a buffer adapted to store values correlated with approximate threshold voltage values associated with substantially each of a set of charge storage regions.

5. The reading circuit according to claim 4, wherein said threshold voltage detection circuit is adapted to use approximate threshold voltage values stored in said buffer when determining a logical state of a given charge storage region.

6. The reading circuit according to claim 1 or 2, wherein the first and second charge storage regions reside on a common NVM cell.

7. The reading circuit according to claim 1 or 2, wherein the first and second charge storage regions reside on adjacent NVM cells.

8. The reading circuit according to claim 1 or 2, wherein said threshold voltage detection circuit is adapted to determine whether the approximate threshold voltage value of the first charge storage region is associated with a first lower logical state or with a second adjacent higher logical state based on the approximate threshold voltage value of the second charge storage region.

9. The reading circuit according to claim 1 or 2, wherein said threshold voltage detection circuit is adapted to associate the approximate threshold voltage value of the first charge storage region with the first lower logical state when the approximate threshold voltage value of the second charge storage region is above a defined value.

10. The reading circuit according to claim 1 or 2, wherein said threshold voltage detection circuit is adapted to associate the approximate threshold voltage value of the first charge storage region with the second higher logical state when the approximate threshold voltage value of the second charge storage region is below a defined value.

* * * * *